US010727022B2

(12) United States Patent
Einat et al.

(10) Patent No.: US 10,727,022 B2
(45) Date of Patent: Jul. 28, 2020

(54) METHODS AND DEVICES FOR PRODUCING AN ELECTRON BEAM

(71) Applicant: ARIEL SCIENTIFIC INNOVATIONS LTD., Ariel (IL)

(72) Inventors: Moshe Einat, Ariel (IL); Yafit Orbach, Ariel (IL); Moritz Pilossof, Ariel (IL)

(73) Assignee: Ariel Scientific Innovations Ltd., Ariel (IL)

( * ) Notice: Subject to any disclaimer, the term of this patent is extended or adjusted under 35 U.S.C. 154(b) by 148 days.

(21) Appl. No.: 15/776,143

(22) PCT Filed: Dec. 26, 2016

(86) PCT No.: PCT/IB2016/058004
§ 371 (c)(1),
(2) Date: May 15, 2018

(87) PCT Pub. No.: WO2017/115265
PCT Pub. Date: Jul. 6, 2017

(65) Prior Publication Data
US 2019/0272968 A1 Sep. 5, 2019

(30) Foreign Application Priority Data
Dec. 27, 2015 (IL) .......................... 243367

(51) Int. Cl.
H01J 29/04 (2006.01)
H01J 29/48 (2006.01)
H01J 29/56 (2006.01)
H01J 1/30 (2006.01)
H01J 37/073 (2006.01)
H01J 23/06 (2006.01)

(52) U.S. Cl.
CPC ................ *H01J 29/04* (2013.01); *H01J 1/30* (2013.01); *H01J 29/485* (2013.01); *H01J 29/563* (2013.01); *H01J 37/073* (2013.01); *H01J 23/06* (2013.01); *H01J 2201/306* (2013.01); *H01J 2237/06341* (2013.01)

(58) Field of Classification Search
None
See application file for complete search history.

(56) References Cited

U.S. PATENT DOCUMENTS 3,678,181 A * 7/1972 Goldmark ................ H04N 5/84
386/307
4,769,712 A * 9/1988 Polaert .................. G02F 1/0333
348/748

(Continued)

FOREIGN PATENT DOCUMENTS

| EP | 1424715 A1 | 6/2004 |
| EP | 1635369 A1 | 6/2004 |
| JP | 2006040835 | 2/2006 |

OTHER PUBLICATIONS

Sjitap Cjem et al., "Electron emission and plasma generation in a modulator electron gun using ferro electric cathode" Nuclear Instruments and Methods in physcs A 566 (2006) p. 662-667.*

(Continued)

*Primary Examiner* — Alexander H Taningco
*Assistant Examiner* — Srinivas Sathiraju
(74) *Attorney, Agent, or Firm* — The Law Office of Joseph L. Felber

(57) ABSTRACT

Disclosed are methods and devices suitable for producing an electron beam.

43 Claims, 9 Drawing Sheets

(56) References Cited

U.S. PATENT DOCUMENTS

| | | | | |
|---|---|---|---|---|
| 4,784,475 | A * | 11/1988 | Polaert | G02F 1/0333 359/262 |
| 4,983,839 | A * | 1/1991 | Deb | C04B 35/475 250/332 |
| 5,453,661 | A * | 9/1995 | Auciello | B82Y 10/00 313/497 |
| 5,631,664 | A * | 5/1997 | Adachi | B82Y 10/00 315/169.3 |
| 6,885,138 | B1 * | 4/2005 | Yoo | B82Y 10/00 313/310 |
| 6,893,489 | B2 * | 5/2005 | Lem | B05D 3/06 106/31.64 |
| 6,911,768 | B2 * | 6/2005 | Chen | B82Y 10/00 313/309 |
| 6,936,972 | B2 * | 8/2005 | Takeuchi | G09G 3/22 315/169.3 |
| 7,365,481 | B2 * | 4/2008 | Kawase | H01J 1/30 313/309 |
| 7,528,539 | B2 * | 5/2009 | Ohwada | B82Y 10/00 313/311 |
| 8,724,368 | B2 * | 5/2014 | Kaneko | H01L 29/6684 257/295 |
| 9,646,797 | B2 * | 5/2017 | Einat | H01J 1/30 |
| 2005/0263808 | A1 * | 12/2005 | Morita | H01J 1/30 257/295 |
| 2010/0094266 | A1 * | 4/2010 | Travish | H01J 35/14 606/15 |
| 2014/0203707 | A1 * | 7/2014 | King | H01J 9/02 315/111.81 |
| 2016/0148773 | A1 * | 5/2016 | Einat | H01J 1/30 313/446 |
| 2019/0272968 | A1 * | 9/2019 | Einat | H01J 37/073 |

OTHER PUBLICATIONS

International Search Report and Written Opinion of International Application No. PCT/IB2016/058004, dated Apr. 6, 2017.

Gundel et al., A Low-Pressure Hollow Cathode Switch Triggered by a Pulsed Electron Beam Emitted from Ferroelectrics, CERN Libraries, Geneva, Switzerland, CERN/PS/88-70 (AR), Nov. 1988.

M. Einat, M. Pilossof, R. Ben-Moshe, H. Hirshbein, and D. Borodin, "95-GHz gyrotron with ferroelectric cathode", Physical Review Letters, vol. 109, p. 185101 (2012).

R. Ben-Moshe and M. Einat, "23 GHz ferroelectric electron gun based gyrotron", Applied Physics Letters, vol. 98, p. 173506 (2011).

Yafit Orbach, Roey Ben-Moshe, Moritz Pilossof, and Moshe Einat, "Gyrotron with dual electrode ferroelectric cathode operating at high repetition rate and long pulse", IEEE Transactions on Electron Devices, vol. 61, No. 3, pp. 921-925, (2014).

M. Einat, E. Jerby, A. Shahadi, "Dielectric-loaded free-electron maser in stripline structure," Nuclear Instruments and Methods A, vol. A375, pp. 21-25 (1996).

Eviatar Avraham, Roey Ben-Moshe, Moritz Pilossof, Moshe Einat, "Frequency-replaceable ferroelectric cathode gyrotron for the entire Ka-band", IEEE Transactions on Electron Devices, vol. 63, Issue: 5, pp. 2097-2103, (2016).

R. Drori, M. Einat, D. Shur, E. Jerby, G. Rosenman, R. Advani, R. J. Temkin, and C. Pralong, "Demonstration of microwave generation by a ferroelectric-cathode tube", Applied Physics Letters, vol. 74, pp. 335-337 (1999).

M. Pilossof and M. Einat, "Lifetime extension of ferroelectric cathodes for microwave tubes", Nuclear Instruments and Methods in Physics Research Section A: Accelerators, Spectrometers, Detectors and Associated Equipment, vol. 636, Issue 1, pp. 8-12, (2011).

M. Einat, D. Shur, E. Jerby, and G. Rosenman, "Lifetime of ferroelectric Pb(Zr,Ti)03 ceramic cathodes with high current density", Journal of Applied Physics, vol. 89, pp. 548-552 (2001).

Yafit Orbach, Moritz Pilossof, and Moshe Einat, "Ferroelectric cathode electron emission dependence on magnetic field", IEEE Transactions on Electron Devices, vol. 61, No. 12, pp. 4268-4272, (2014).

Yafit Orbach, Tuviya Nissan, Yedidya Bauer, Moritz Pilossof, Moshe Einat, "Experimental study of 50kV/3.5A hollow electron beam produced by ferroelectric cathode", IEEE Transactions on Electron Devices, vol. 63, 5, pp. 2156-2162, (2016).

* cited by examiner

METHODS AND DEVICES FOR PRODUCING AN ELECTRON BEAM

RELATED APPLICATION

The present application gains priority from Israel Patent Application No. IL 243367 filed 27 Dec. 2015, which is included by reference as if fully set-forth herein.

FIELD AND BACKGROUND OF THE INVENTION

The invention, in some embodiments, relates to the field of electron beam emission and more particularly, but not exclusively, to methods and devices suitable for producing an electron beam.

In the 1990s, ferroelectric emitters for emitting electrons using polarization reversal were studied, see for example U.S. Pat. Nos. 5,453,661, 5,874,802 and EP 0428853B1.

In a typical example discussed with reference to FIGS. 1A and 1B, a film 10 (typically 1-10 micrometers thick, reported up to 100 micrometers thick) of ferroelectric material (such as PZT or PZLT) is sandwiched between a complete back electrode 12 and a perforated front electrode 14 (1-5 micrometers thick) including at least one small perforation 16 (~10 micrometers diameter, ~31.4 micrometer circumference), and a high transparency isolation grid 18 10-20 micrometers distally from front electrode 14 separated by a vacuum 20 (not greater than $10^{-3}$ Millibar).

For use, an AC power supply 22 is activated to apply a megahertz alternating current of up to ±100 V between electrodes 12 and 14 while a negative DC extraction potential of up to −200V) is applied to extraction grid 18.

When the phase of the current applied by power supply 22 is such that the potential on front electrode 14 is positive (FIG. 1A), ferroelectric film 10 is polarized in a direction 24a so that electrons accumulate at the bottom of hole 16 on the face of ferroelectric film 10.

When the phase of the voltage applied by power supply 22 is such that the potential on front electrode 14 is negative (FIG. 1B), ferroelectric film 10 is polarized in a direction 24b. The electrons accumulated in hole 16 on the face of ferroelectric film 10 are repelled into vacuum 20 to be extracted and accelerated by extraction grid 18 to form an electron beam.

Such ferroelectric emitters have been for the most part abandoned due to the very low current of electrons that these can produce.

SUMMARY OF THE INVENTION

Some embodiments of the invention herein relate to methods for producing electron beams and paraelectric electrodes and electron guns suitable for producing electron beams, that in some embodiments are relatively intense.

Specifically, some embodiments of the teachings disclosed herein relate to the extraction of electrons from plasma generated with a simple paraelectric cathode including a paraelectric layer sandwiched between a back electrode and a front electrode with at least one hole, where the plasma is generated inside the hole by application of a sufficient excitation potential difference between the back electrode and the front electrode. Additionally, it has been found that the cross section of an electron beam formed by extracting electrons from the plasma reflects the shape of the pattern of the holes in the front electrode, for example, an annular pattern of holes leads to an electron beam having an annular cross section.

Thus, according to an aspect of some embodiments of the invention there is provided an electron gun, comprising:
a paraelectric cathode including:
 a paraelectric layer, of paraelectric material, having a proximal face and a distal face, the paraelectric layer sandwiched between:
  on the proximal face, a back electrode; and
  on the distal face, a front electrode including at least one hole,
the hole providing fluid communication between the distal face of the paraelectric layer and a volume distal to the front electrode.

In some embodiments, the distal face of the paraelectric layer is planar.

In some embodiments, the front electrode is planar and of a uniform thickness.

In some embodiments, the at least one hole comprises at least two holes arranged in a predetermined pattern on the front electrode.

According to an aspect of some embodiments of the invention there is also provided a method of producing an electron beam, comprising:
a. providing an electron gun according to the teachings herein, including a paraelectric cathode having a paraelectric layer sandwiched between a back electrode and front electrode, and an anode;
b. during a rest period, maintaining the back electrode at a back electrode rest potential and the front electrode at a front electrode rest potential, both rest potentials not less than −500 V different from an anode potential (the potential of the anode), wherein the electrode rest potential difference value (the absolute value of the difference between the back electrode rest potential and the front electrode rest potential) is not greater than 200 V;
c. applying at least one excitation potential pulse having a duration not greater than 2.5 microsecond to the paraelectric cathode, wherein:
 i. during the application of the excitation potential pulse, increasing the absolute value of the potential difference between the front electrode and the back electrode to not less than 300 V greater than the electrode rest potential difference value at a rate not slower than 6 V/nanosecond, thereby generating plasma in the at least one hole of the front electrode,
 ii. subsequent to 'i', maintaining the generated plasma in the at least one hole for a period of not less than 50 nanoseconds, and
 iii. subsequent to 'ii', extinguishing the plasma by reducing the value of the potential difference between the front electrode and the back electrode; and
d. during 'c', extracting electrons from the generated plasma towards the anode as a beam of electrons.

Unless otherwise defined, all technical and scientific terms used herein have the same meaning as commonly understood by one of ordinary skill in the art to which the invention pertains. In case of conflict, the specification, including definitions, takes precedence.

As used herein, the terms "comprising", "including", "having" and grammatical variants thereof are to be taken as specifying the stated features, integers, steps or components but do not preclude the addition of one or more additional features, integers, steps, components or groups thereof.

As used herein, the indefinite articles "a" and "an" mean "at least one" or "one or more" unless the context clearly dictates otherwise.

As used herein, when a numerical value is preceded by the term "about", the term "about" is intended to indicate +/−10%.

BRIEF DESCRIPTION OF THE FIGURES

Some embodiments of the invention are described herein with reference to the accompanying figures. The description, together with the figures, makes apparent to a person having ordinary skill in the art how some embodiments of the invention may be practiced. The figures are for the purpose of illustrative discussion and no attempt is made to show structural details of an embodiment in more detail than is necessary for a fundamental understanding of the invention. For the sake of clarity, some objects depicted in the figures are not to scale.

In the Figures.

DESCRIPTION OF SOME EMBODIMENTS OF THE INVENTION

Figure 1A:
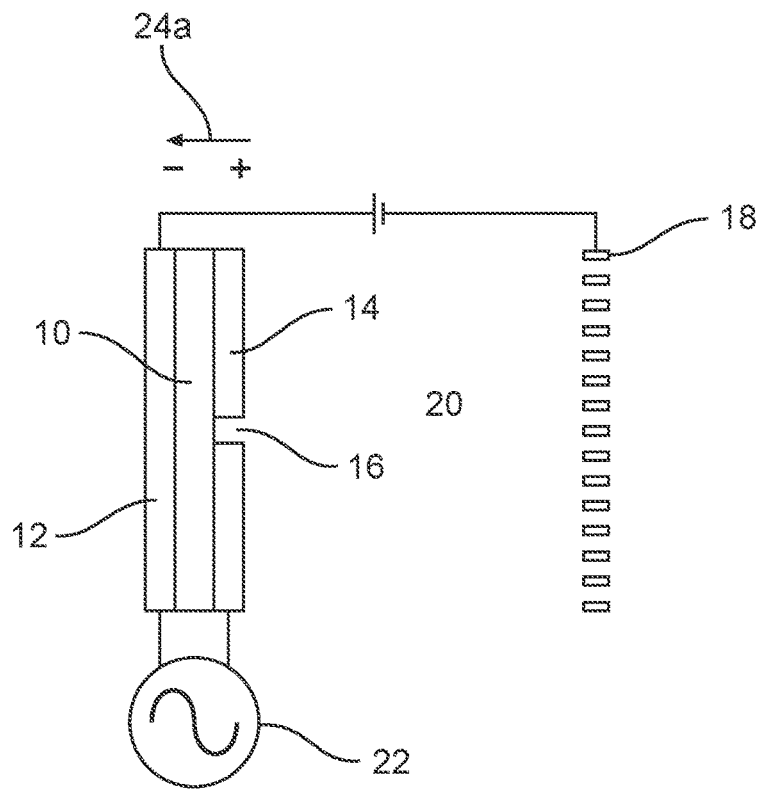
FIGS. 1A and 1B (prior art) are schematic depictions of a ferroelectric emitter for emitting electrons using polarization reversal in side cross-section.
Figure 1B:
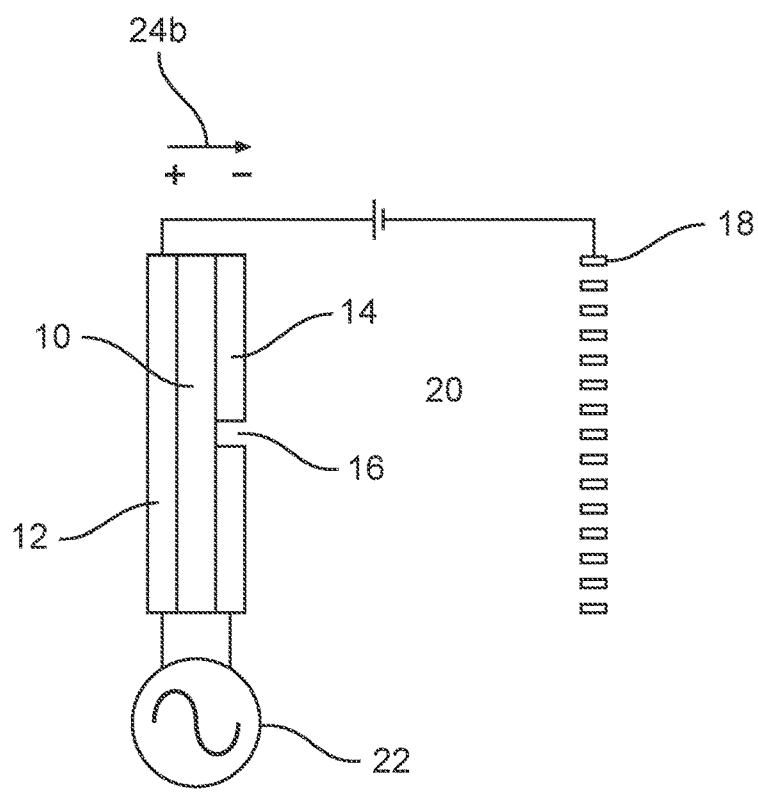

Some embodiments of the invention herein relate to methods for producing electron beams and paraelectric electrodes and electron guns suitable for producing electron beams.

Specifically, some embodiments of the teachings disclosed herein relate to the extraction of electrons from plasma generated with a simple paraelectric cathode including a paraelectric layer sandwiched between a back electrode and a front electrode with at least one hole, where the plasma is generated inside the hole of the front electrode by application of a sufficient excitation potential difference between the back electrode and the front electrode.

Additionally, it has been found that the cross section of an electron beam formed by extracting electrons from the plasma reflects the shape of the pattern of the holes in the front electrode, for example, an annular pattern of holes leads to an electron beam having an annular cross section.

Thus according to an aspect of some embodiments of the teachings herein, there is provided an electron gun, comprising:

a paraelectric cathode including:
  a paraelectric layer, of paraelectric material, having a proximal face and a distal face, the paraelectric layer sandwiched between:
    on the proximal face, a back electrode; and
    on the distal face, a front electrode including at least one hole,
the hole providing fluid communication between the distal face of the paraelectric layer and a volume distal to the front electrode.

According to an aspect of some embodiments of the invention there is also provided a method of producing an electron beam, comprising:

a. providing an electron gun according to the teachings herein, including a paraelectric cathode having a paraelectric layer sandwiched between a back electrode and front electrode, and an anode;

b. during a rest period, maintaining the back electrode at a back electrode rest potential and the front electrode at a front electrode rest potential, both rest potentials not less than −500 V different from an anode potential (the potential of the anode), wherein the electrode rest potential difference value (the absolute value of the difference between the back electrode rest potential and the front electrode rest potential) is not greater than 200 V;

c. applying at least one excitation potential pulse having a duration not greater than 2.5 microsecond to the paraelectric cathode, wherein:
  i. during the application of the excitation potential pulse, increasing the absolute value of the potential difference between the front electrode and the back electrode to not less than 300 V greater than the electrode rest potential difference value at a rate not slower than 6 V/nanosecond, thereby generating plasma in the at least one hole of the front electrode,
  ii. subsequent to 'i', maintaining the generated plasma in the at least one hole for a period of not less than 50 nanoseconds, and
  iii. subsequent to 'ii', extinguishing the plasma by reducing the value of the potential difference between the front electrode and the back electrode; and d. during 'c', extracting electrons from the generated plasma towards the anode as a beam of electrons.

Without wishing to be held to any one theory, it is currently believed that application of the initial portion of the excitation potential pulse (i') characterized by rapidly increasing the absolute value of the potential difference between the front electrode and the back electrode leads to emission of electrons in the holes of the front electrode by field emission at the front electrode/paraelectric layer/volume interface. If sufficient electrons are emitted, the emitted electrons interact with the surface of the paraelectric layer to generate a plasma that is self-perpetuating ('ii') as long as the absolute value of the potential difference between the front electrode and the back electrode is sufficient. Without wishing to be held to any one theory, it is currently believed that a period of continuous plasma generation must be limited in time (for a duration not greater than 2.5 microseconds) to prevent voltage breakdown and/or short circuit and/or damage to the front electrode.

Electrons are extracted from the generated plasma by an electrical field generated between the more negative front electrode and the more positive anode. It has been found that, in some embodiments, extraction of electrons from the generated plasma and formation of an electron beam therefrom can be improved by the presence of an isolation electrode in the volume between the front electrode and the anode, where the potential of the isolation electrode is maintained at not less than 100 V more positive than the potential of the front electrode. Without wishing to be held to any one theory, it is currently believed that such an isolation electrode acts as a "filter" to isolate electrons from accompanying positive ions by electrostatically repelling the positive ions towards the front electrode while allowing the electrons to travel towards the anode. Technical details of an isolation electrode are discussed hereinbelow.

The principles, uses and implementations of the teachings of the invention may be better understood with reference to the accompanying description and figures. Upon perusal of the description and figures present herein, one skilled in the art is able to implement the teachings of the invention without undue effort or experimentation. In the figures, like reference numerals refer to like parts throughout.

Before explaining at least one embodiment of the invention in detail, it is to be understood that the invention is not necessarily limited in its application to the details of construction and the arrangement of the components and/or methods set forth herein. The invention is capable of other embodiments or of being practiced or carried out in various ways. The phraseology and terminology employed herein are for descriptive purpose and should not be regarded as limiting.

Electron Gun Including a Paraelectric Cathode

According to an aspect of some embodiments of the teachings herein, there is provided an electron gun, comprising:
a paraelectric cathode including:
a paraelectric layer, of paraelectric material, having a proximal face and a distal face, the paraelectric layer sandwiched between:
on the proximal face, a back electrode; and
on the distal face, a front electrode including at least one hole, the hole providing fluid communication between the distal face of the paraelectric layer and a volume distal to the front electrode.

In some embodiments, the distal face of the paraelectric layer is planar.

In some embodiments, the front electrode is planar and of a uniform thickness.

In some embodiments, the proximal face of the paraelectric layer is planar.

In some embodiments, the back electrode is planar and of a uniform thickness.

Electrical Leads

In some embodiments, the electron gun further comprises electrical leads functionally associated with the front electrode and the back electrode, the electrical leads configured:
to carry a front electrode rest potential to the front electrode and a back electrode rest potential to the back electrode, both electrode rest potentials of not less than −500 V different from an anode potential; and
to carry to at least one of the front electrode and the back electrode an excitation potential pulse that increases the absolute value of the potential difference between the front electrode and the back electrode by not less than 300 V at a rate not slower than 6 V/nanosecond from the potential difference between the electrode rest potentials.

In some embodiments, the electrical leads are configured to carry a front electrode rest potential that is the same as a respective back electrode rest potential. In some embodiments, the electrical leads are configured to carry a front electrode rest potential that is different from a respective back electrode rest potential.

In some embodiments, the electrical leads are more robust, configured to carry rest potentials of not less than −1000 V, not less than −2000 V, and even not less than −2500 V different from an anode potential. In some embodiments, especially embodiments configured for producing high-energy electron beams, the electrical leads are configured to carry rest potentials of not less than −2.4 kV, not less than −5 kV, not less than −10 kV, not less than −20 kV, and even not less than −30 kV different from the anode potential. In an experimental embodiment described herein, the electrical leads were configured to carry rest potentials that were −3 kV different from the anode potential, and in another experimental embodiment rest potentials that were −50 kV different from the anode potential.

In some embodiments, the electrical leads are configured to carry an excitation potential pulse that increases the absolute value of the potential difference between the front electrode and the back electrode by not less than 500 V, not less than 700 V, not less than 1000 V, not less than 1200 V, not less than 1400 V, not less than 2000 V, not less than 2500 V and even not less than 3000 V.

Isolation Electrode

As noted above, it has been found that in some embodiments the extraction of electrons from the plasma generated in the holes of the front electrode can be improved by the presence of an isolation electrode in the volume between the front electrode and an anode, where the potential of the isolation electrode is maintained at not less than 100 V more positive than the potential of the front electrode.

Accordingly, in some embodiments, the electron gun further comprises, distal to the front electrode in the volume, an isolation electrode.

In some embodiments, the electron gun further comprises an electrical lead functionally associated with the isolation electrode.

In some embodiments, the electrical lead functionally associated with the isolation electrode is configured to carry a potential that is not less than 200 V, not less than 300 V, not less than 400 V and even not less than 500 V more positive than the potential of the front electrode.

In some embodiments, the electrical lead functionally associated with the isolation electrode and an electrical lead functionally associated with the back electrode are configured to simultaneously provide a same potential. Such configuration is technically easy to make and operate, requiring fewer components such as leads and power supplies.

The isolation electrode is of any suitable material and construction as known in the art of electron guns.

The isolation electrode is of any suitable shape, for example, in some embodiments selected from the group consisting of a ring, a cylinder, a rod, a sheet, at least two rods and at least two sheets.

That said, in some preferred embodiments the isolation electrode is a grid (including structures such as a net, a mesh, a lattice, a web) positioned so that electrons extracted from the plasma towards an anode pass through the gaps of the grid. Without wishing to be held to any one theory, it is currently believed that an isolation electrode that is a grid acts as a relatively effective barrier to the passage of positive ions while allowing extracted electrons to pass through the isolation electrode towards an anode.

In some embodiments, the isolation electrode defines a plane, wherein the plane is substantially parallel to the distal face of the paraelectric layer. For example, in some embodiments where the isolation electrode is a grid, the defined plane is the plane of the grid.

The isolation electrode is any suitable distance from the distal surface of the front electrode. Without wishing to be held to any one theory, it is currently believed that if an isolation electrode is too close to the distal surface of the front electrode, the excitation potential pulses will necessarily be short to avoid voltage break down, leading to relatively low current of electrons produced by the electron gun. Accordingly, in some embodiments, the isolation electrode is not less than 500 micrometers, not less than 1 mm, not less than 2 mm, and in some embodiments even not less than 4 mm from the distal surface of the front electrode. Typically, the isolation electrode is not more than 5 cm from the distal surface of the front electrode.

In some embodiments, an isolation electrode is configured to carry a single potential. In some embodiments, an isolation electrode comprises at least two parts, each part configured to optionally carry a different potential, some such embodiments allowing some focusing or redirecting of a produced electron beam. In some embodiments, such configuration includes the parts electrically isolated one from the other and/or each part functionally associated with different electrical leads.

In an experimental prototype of an electron gun according to the teachings herein, the isolation electrode was a 0.3-mm thick circular grid (40% material, thereby having 60% transparency) made by laser-cutting of a 0.3 mm-thick copper sheet positioned 9 mm from the distal surface of the front electrode.

Front Electrode and a Back Electrode

The back electrode is any suitable electrode associated with the paraelectric layer through the proximal face thereof. The front electrode is any suitable electrode associated with the paraelectric layer through the distal face thereof, and includes at least one hole, the hole providing fluid communication between the distal face of the paraelectric layer and a volume distal to the front electrode.

The front and back electrodes each covers any suitable portion of the respective face of the paraelectric layer. In some embodiments, the front and/or back electrode covers not less than 80%, not less than 85%, not less than 90% and even not less than 95% of the surface area of the respective face of the paraelectric layer.

In some embodiments it is preferred that the back electrode cover any portion of the proximal face of the paraelectric layer that is across from any of the holes of the front electrode. In some embodiments, the front electrode is a complete uninterrupted sheet that is devoid of holes.

The front and back electrodes are of any suitable thickness. In some embodiments, the front and/or back electrode is not less than 1 micrometer thick and not more than 10 cm thick. In some embodiments, the front and back electrodes have the same thickness. In some embodiments, the front and back electrodes have a different thickness one from the other That said, due to the desire to provide a compact electron gun, typically the back electrode is not more than 1 cm thick, not more than 6 mm thick, not more than 4 mm thick, and even not more than 2 mm thick.

To prevent the hole of the front electrode from being too deep, typically the front electrode is not more than 2 mm thick and even not more than 1 mm thick.

A paraelectric cathode including a thin front or back electrode can function to implement the teachings herein. However, thin electrodes have a number of disadvantages for certain embodiments.

For instance, it is preferred that the front and back electrodes be flat and of uniform thickness, in some embodiments in order to have a better-defined and more homogeneous electrical field, but it is more challenging and expensive to manufacture flat and thin electrodes having a uniform thickness. Thin electrodes are more easily damaged, e.g., by scratching or abrasion, for example when assembling the electron gun and connecting electrical leads, and for the front electrode by the effect of plasma. Additionally, thin electrode provide little structural support to the paraelectric layer. Accordingly, in some embodiments, the front and/or back electrode is not less than 10 micrometers, not less than 20 micrometers and even not less than 25 micrometers thick.

The front and back electrodes are each made of any suitable material using in any suitable fashion using any suitable technique.

Typically, the front and back electrodes are made of an electrically conductive material, in some embodiments, selected from the group consisting of Cu, Ag, Au, Al alloys thereof, and combinations thereof. Due to the relatively high price of Ag and Au, in some embodiments it is preferred that the electrodes be made of Cu, Al or conductive alloys thereof.

A person having ordinary skill in the art is able to implement a suitable technique for manufacture of a front and/or back electrode upon perusal of the disclosure herein.

In some embodiments, a front and/or back electrode is made by one or more of vapor deposition of a suitable conductive material (e.g., metal), applying a conductive paint, and applying a conductive putty (e.g., metal clay or metal paste) to the respective face of the paraelectric layer.

In some embodiments, a preformed electrode (e.g., a conductive disk, for example, of a metal) is attached to the respective face of the paraelectric layer, for example, by welding or with the use of an adhesive.

A particularly suitable method for manufacture of a front or back electrode that is quick, easy, cheap and typically yields good results comprises making the front and/or back electrode from a conductive foil tape that is attached to the respective face of the paraelectric layer with use of the adhesive of the conductive foil tape, where the tape is trimmed to the shape of the electrode either prior or subsequent to attachment. An additional advantage of using conductive foil tape is that the adhesive/foil combination provides robustness to the paraelectric cathode.

The at least one hole of the front electrode is made in any suitable fashion. In some embodiments, an incipient front electrode is first attached to the distal face of the paraelectric layer, and subsequently the at least one hole is made, for example by etching or ablation (e.g., laser ablation). In some embodiments, the at least one hole is made together with the front electrode, for example, by lithographic methods during the time when the material constituting the front electrode is contacted with the distal face of the paraelectric layer. In some embodiments where a preformed incipient front electrode is secured to the distal face, the holes are made prior to the securing of the incipient front electrode to the distal face of the paraelectric later. In some embodiments (e.g., when the front electrode is made from a conductive foil tape), the holes are made prior to attaching the incipient front electrode to the paraelectric layer by piercing the incipient front electrode, for example with a tool such as a needle or pin having the desired dimensions for the hole: in such a way, a front electrode having a desired or custom pattern of holes can be quickly and easily made with no special tools.

Accordingly, in some embodiments, the back electrode and/or the front electrode directly contacts the respective face of the paraelectric layer.

Accordingly, in some embodiments the back electrode and/or the front electrode contacts the respective face of the paraelectric layer through at least one intervening layer, in some such embodiments, the electrode being not more than 1 mm and even not more than 100 micrometer distant from the respective face. In some such embodiments, the at least one intervening layer constitutes an adhesive maintaining the electrode associated with the respective face of the paraelectric layer.

In an experimental prototype of an electron gun according to the teachings herein, both the front and back electrodes were 0.064 mm (64 micrometers) thick copper foil secured to the respective face of the paraelectric layer with a 0.036 mm (36 micrometers) thick layer of adhesive.

Holes of the Front Electrode

As noted above, the front electrode includes at least one hole, the hole providing fluid communication between the distal face of the paraelectric layer and a volume distal to the front electrode. In some embodiments, the at least one hole is at least two holes, at least three holes, at least four holes, at least six holes, at least eight holes and even at least twelve holes.

The holes are separated one from the other by any suitable distance. In some embodiments, the minimal distance between any two of the holes is not less than 200 micrometers, not less than 300 micrometers and even not less than 500 micrometers.

The holes are of any suitable shape. In some embodiments, nearest the distal surface of the paraelectric layer, at least one (preferably all) of the holes has the shape of a continuous closed curve, devoid of vertices. In some such embodiments, the continuous closed curve shape is selected from the group consisting of a circle, an oval and an ovoid.

In some embodiments, the walls of at least one of the at least one hole are substantially perpendicular to the distal surface of the paraelectric layer.

In some embodiments, the walls of at least one of the at least one hole outwardly diverge from the distal surface of the paraelectric layer towards the volume.

The holes are of any suitable size.

In some embodiments, nearest the distal surface of the paraelectric layer, at least one (preferably all) of the at least one hole has a circumference of not less than 63 micrometers (equivalent to a 20-micrometer diameter circle), not less than 160 micrometers (equivalent to a 50-micrometer diameter circle), not less than 314 micrometers (equivalent to a 100-micrometer diameter circle), not less than 630 micrometers (equivalent to a 200-micrometer diameter circle), and even not less than 945 micrometers (equivalent to a 300-micrometer diameter circle).

In some embodiments, nearest the distal surface of the paraelectric layer, at least one (preferably all) of the at least one hole has a circumference of not more than 28 mm (equivalent to 9000 micrometers/9 mm diameter circle), not more than 12.6 mm (equivalent to 4000 micrometers/4 mm diameter circle), and even not more than 9.4 mm (equivalent to 3000 micrometers/3 mm diameter circle).

In embodiments including at least two holes, the at least two holes are arranged in any suitable way on the front electrode.

In some embodiments including at least two holes, the at least two holes are arranged in a predetermined pattern on the front electrode. In some embodiments, the predetermined pattern is centered around the central axis of the paraelectric cathode. In some embodiments, the predetermined pattern is selected from the group consisting of a line, a solid closed curve and a hollow closed curve. In some embodiments, a cross-sectional shape of an electron beam produced by the electron gun corresponds to the shape of the predetermined pattern.

In some embodiments, the predetermined pattern is a line selected from the group consisting of a straight line and a curved line. Some such embodiments are useful for producing flat, planar or curved-planar electron beams, useful for example in the field of electron lithography, electron welding, electron beam machining and electron melting methods.

In some embodiments, the predetermined pattern is a hollow closed curve selected from the group consisting of a circular ring, an oval ring, an ovoid ring, a triangular ring and a square ring. Some such embodiments are useful for driving radiation generation devices, for example, annular electron beams produced by a circular ring pattern of holes are useful for driving gyrotrons.

In an experimental prototype of an electron gun according to the teachings herein, the front electrode included twenty-seven 600 micrometer-diameter round holes, the holes arranged in a circle (circular ring) where each hole was about 1.5 mm from the two neighboring holes.

Paraelectric Layer

As noted above, a paraelectric cathode according to the teachings herein includes a paraelectric layer of paraelectric material.

Any suitable paraelectric material may be used. In some embodiments, the paraelectric material is a paraelectric ceramic. In some embodiments, the paraelectric material is not ferroelectric. In some embodiments, the paraelectric material is ferroelectric as well as paraelectric.

Typically, the paraelectric layer has a relatively high relative permittivity ($\varepsilon r$), in some embodiments a relative permittivity of not less than 500, not less than 700, not less than 800, not less than 900 and even not less than 1000.

In some embodiments, the paraelectric material is selected from the group consisting of $BaTiO_3$ ($\varepsilon r$=1200-10000), $CaCu_3Ti_4O_{12}$ ($\varepsilon r$>250000), conjugated polymers (having sufficiently high $\varepsilon r$, see Pohl HA 1986 in J Elec Mat 1986 15: 201), PZT (lead zirconate titanate, $\varepsilon r$=500-6000) and PZLT (lead zirconate lanthanum titanate).

The paraelectric layer is of any suitable thickness. Since the generation of plasma in the hole causes physical damage to the paraelectric layer (currently believed due to ablation by the plasma), it is preferable that the paraelectric layer be relatively robust. Accordingly, in some embodiments, the paraelectric layer is not less than 150 micrometers, not less than 300 micrometers, not less than 600 micrometers, not less than 800 micrometers and even not less than 1000 micrometers thick. Typically, the paraelectric layer is not more than 10 millimeters, and in some embodiments, not more than 5 millimeters thick.

In an experimental prototype of an electron gun according to the teachings herein, the paraelectric layer was a 2 mm-thick 27 mm-diameter $BaTiO_3$ disk having flat distal and proximal faces.

Anode

In some embodiments, an electron gun according to the teachings herein comprises an anode located distally to the front electrode in the volume distal from the front electrode, inter alia, to extract electrons from a plasma generated in the at least one hole of a front electrode and to accelerate a thus-produced electron beam to a desired energy. In some embodiments, the anode is located distally to an isolation electrode. In some embodiments, an electron gun further comprises electrical leads functionally associated with the anode. In some embodiments, the anode is configured to be grounded, in some embodiments through electrical leads functionally associated with the anode.

An anode is any suitable distance from the front electrode. In some embodiments, the anode is relatively close, not less than 1 cm and no more than 3 cm from the front electrode. A disadvantage of some such embodiments is that relatively short-duration excitation potential pulses and relatively long rest periods are sometimes required to avoid voltage breakdown and short circuits, so that the maximal current of electrons produced and/or maximal duty cycle are relatively modest. In some embodiments, the anode is not less than 3 cm, not less than 4 cm and even not less than 5 cm from the front electrode, allowing production of substantial electron current and/or relatively high maximal duty cycle. In some embodiments, the anode is not more than 10 cm from the front electrode.

The anode is of any suitable shape, for example, in some embodiments selected from the group consisting of a grid, a ring, a cylinder, a rod, a sheet, at least two rods and at least two sheets.

Sub-Anode

It has been found that when the absolute value of the potential difference between the front and back electrode rest potentials and the anode is very high, for example, higher than 10 kV, there is an increased incidence of voltage breakdown while electrons are extracted from plasma generated in a hole of the front electrode. The incidence of such voltage breakdown increases with increasing absolute value of potential difference between the electrode rest potentials and the anode. It has been found that positioning a sub-anode just distally from an isolation electrode reduces the incidence of voltage breakdown.

Thus, in some embodiments, an electron gun further comprises, in addition to an isolation electrode, a sub-anode located in the volume distal to the isolation electrode. It has been found that when a suitable potential is applied to the sub-anode, not only is the incidence of voltage breakdown reduced, but also the duration of a produced electron beam is reduced, becoming almost equal to the duration of a corresponding excitation potential pulse. As discussed in greater detail below, a typical suitable such potential has been found to be such that the potential difference between the sub-anode and the isolation electrode is not less than 100 V, not less than 200 V, not less than 300 V and even not less than 600V but preferably not more than 1000 V, where the sub-anode is more positive than the isolation electrode. Without wishing to be held to any one theory, it is currently believed that such a sub-anode advantageously changes the electrical field between the front electrode and the anode.

In some embodiments, an electron gun further comprises electrical leads functionally associated with the sub-anode, the electrical leads configured to carry a DC potential of not less than 100 V different from the potential of the isolation electrode. In some embodiments, the electrical leads functionally associated with the sub-anode are configured to carry a DC potential of not less than 200 V, not less than 300 V and even not less than 600 V different from the potential of the isolation electrode.

The sub-anode is of any suitable material, shape and construction as known in the art.

The sub-anode is of any suitable shape, for example, in some embodiments selected from the group consisting of a grid, a ring, a cylinder, a rod, a sheet, at least two rods and at least two sheets.

In some embodiments, a sub-anode is configured to carry a single potential. In some embodiments, a sub-anode comprises at least two parts, each part configured to optionally carry a different potential, some such embodiments allowing some focusing or redirecting of a produced electron beam.

A sub-anode is any suitable distance distal to the isolation electrode. In some embodiments, the sub-anode is not less than 2 mm, not less than 3 mm, not less than 4 mm and even not less than 5 mm from the isolation electrode. In some embodiments, the sub-anode is not more than 4 cm, not more than 3 cm and even not more than 2 cm from the isolation electrode.

In an experimental prototype of an electron gun according to the teachings herein, the sub-anode was a 20 mm-long copper cylinder that encircled the isolation electrode and which distal end protruded 5 mm distally from the isolation electrode.

Electrical Power Supply

In some embodiments, an electron gun further comprises an electrical power supply, configured to provide at least some of the electrical power required for operating the electron gun according to the teachings herein. An electrical power supply is as known in the art of electron guns and includes one or more components, sub-assemblies and assemblies. In some embodiments, the various parts of an electrical power supply are operated and controlled using a single controller, that in some embodiments is considered a component of the electrical power supply. In some embodiments, at least two parts of the power supply are independently controllable.

An electrical power supply is typically functionally associated with a component of the electron gun through electrical leads. As noted above, in some embodiments at least some of the electrical leads are a component of the electron gun that are functionally associated with another component of the electron gun. In some embodiments, at least some of the electrical leads are a component of the electrical power supply and/or are considered independent components.

Power Supply to Back Electrode and Front Electrode

As noted above, in some embodiments the paraelectric cathode of an electron gun according to the teachings herein comprises a back electrode and a front electrode. In some such embodiments, the electrical power supply is functionally associated with the back electrode and the front electrode (e.g., through electrical leads) and is configured to:

provide a back electrode rest potential to the back electrode and a front electrode rest potential to the front electrode of not less than −500V different from an anode; and on activation, to provide an excitation potential pulse to at least one of the front electrode and the back electrode, the excitation pulse sufficient to increases the absolute value of the potential difference between the front electrode and the back electrode by not less than 300 V at a rate not slower than 6 V/nanosecond.

Back Electrode Rest Potential and Front Electrode Rest Potential

As noted above, in some embodiments an electron gun according to the teachings herein comprises a power supply configured to provide a back electrode rest potential to the back electrode and a front electrode rest potential to the front electrode of not less than −500V different from an anode.

In some embodiments, the power supply is configured to provide a back electrode rest potential and a front electrode rest potential that are different. In some such embodiments, the power supply is configured so that the absolute value of the difference between the back electrode rest potential and front electrode rest potential (called the electrode rest potential difference value) is not greater than 200V, not greater than 150V, not greater than 100V, not greater than 50V and even not greater than 25V.

In some embodiments, the power supply is configured to provide a back electrode rest potential and a front electrode rest potential that are the same.

In some embodiments, the power supply is configured to provide a back electrode rest potential to the back electrode and a front electrode rest potential to the front electrode of not less than −1000 V, not less than −2000 V, and even not less than −2500 V different from an anode potential. In some embodiments, the power supply is configured to provide a back electrode rest potential to the back electrode and a front electrode rest potential to the front electrode of not less than −2.4 kV, not less than −5 kV, not less than −10 kV, not less than −20 kV, and even not less than −30 kV different from the anode potential.

Excitation Potential Pulse

As noted above, in some embodiments an electron gun according to the teachings herein comprises a power supply configured to, on activation, provide an excitation potential pulse to at least one of the front electrode and the back electrode, the excitation pulse sufficient to increases the absolute value of the potential difference between the front electrode and the back electrode by not less than 300 V at a rate not slower than 6 V/nanosecond.

In some embodiments, the power supply is configured to provide an excitation potential pulse having a rate of increase of the absolute value of the potential difference between the front electrode and the back electrode that is not slower than 10 V/nanosecond, not slower than 15 V/nanosecond and even not slower than 20 V/nanosecond.

In some embodiments, the power supply is configured to provide an excitation potential pulse such that during application of the excitation potential pulse, the absolute value of the potential difference between the front electrode and the back electrode is increased to not less than 500 V, not less than 700 V, not less than 1000 V, not less than 1200 V and even not less than 1400 V greater than the electrode rest potential difference value. In some embodiments, especially embodiments configured for producing high-energy electron beams, the power supply is configured to provide an excitation potential pulse such that during application of the excitation potential pulse, the absolute value of the potential difference between the front electrode and the back electrode is increased to not less than 2000 V, not less than 2500 V and even not less than 3000 V.

In some embodiments, the power supply is configured such that an excitation potential pulse increases the potential of the front electrode, in some such embodiments, while maintaining the potential of the back electrode substantially constant.

In some embodiments, the power supply is configured such that an excitation potential pulse decreases the potential of the front electrode, in some such embodiments, while maintaining the potential of the back electrode substantially constant.

In some embodiments, the power supply is configured such that an excitation potential pulse increases the potential of the back electrode, in some such embodiments, while maintaining the potential of the front electrode substantially constant.

In some embodiments, the power supply is configured such that an excitation potential pulse decreases the potential of the back electrode, in some such embodiments, while maintaining the potential of the front electrode substantially constant.

In some embodiments, the power supply is configured such that an excitation potential pulse increases the potential of the back electrode while decreasing the potential of the back electrode.

In some embodiments, the power supply is configured such that an excitation potential pulse decreases the potential of the back electrode while increasing the potential of the back electrode.

In some embodiments, the power supply is configured to apply an excitation potential pulse having a duration of not more than 2 microseconds, not more than 1.5 microseconds and even not more than 1 microsecond.

In some embodiments, the power supply is configured to apply an excitation potential pulse having a duration of not less than 50 nanoseconds, not less than 75 nanoseconds and in some embodiments not less than 100 nanoseconds.

Train of Excitation Potential Pulses

In some embodiments, the electrical power supply is configured to provide a train of successive excitation potential pulses allowing generation of an electron beam having a relatively long duration. In some embodiments, a train of successive excitation potential pulses comprises not less than two successive excitation potential pulses, not less than four successive excitation potential pulses, not less than eight successive excitation potential pulses and even not less than sixteen successive excitation potential pulses within a period of 1 millisecond, with a rest period separating any two successive excitation potential pulses, in some preferred embodiments during which rest period both the front and back electrodes are maintained at a respective rest potential.

In some embodiments, the power supply is configured so that at least one, preferably all, rest periods have a duration of not less than 100 nanoseconds.

In some embodiments, the power supply is configured so that at least one, preferably all, rest periods have a duration that is not shorter than the duration of a preceding excitation potential pulse.

In some embodiments, the power supply is configured so that, a rest period has a duration that is of substantially the same duration as that of a preceding excitation potential pulse.

In some embodiments, the power supply is configured so that rest periods have a duration that is greater than the duration of a preceding excitation potential pulse.

In some embodiments, the power supply is configured so that the train of excitation potential pulses is unipolar. In some embodiments, the power supply is configured so that the train of excitation potential pulses is bipolar.

In some embodiments, the power supply is configured so that the waveform of the train of excitation potential pulses is selected from the group consisting of a square wave, a pulse wave and a sawtooth wave.

Power Supply to Isolation Electrode

As noted above, in some embodiments an electron gun according to the teachings herein comprises an isolation electrode. In some such embodiments, the electrical power supply is functionally associated with the isolation electrode (e.g., through electrical leads) and is configured to provide a DC potential to the isolation electrode.

In some embodiments, the electrical power supply is configured to provide a DC potential to the isolation electrode so that during application of an excitation potential pulse, the potential of the isolation electrode is not less than 100 V, not less than 200 V, not less than 300 V, not less than 400 V and even not less than 500 V more positive than the potential of the front electrode.

In some embodiments, the electrical power supply is configured to provide a DC potential to the isolation electrode so that during application of an excitation potential pulse, the potential of the isolation electrode is not more than 1000 V, not more than 800 V, not more than 600 V, not more than 400 V and even not more than 200 V different from the potential of the back electrode. In some embodiments, the electrical power supply is configured to provide a DC potential to the isolation electrode that is substantially identical to that of the back electrode, a configuration that is technically easy to make and operate, requiring fewer components such as leads and power supplies.

In some embodiments, the isolation electrode comprises two parts and the electrical power supply is configured to provide a different potential to each one of the two parts. Typically, the difference between the two provided potentials is not greater than 100 V, and in some embodiments, not greater than 80 V and even not greater than 60 V.

In an experimental prototype of an electron gun according to the teachings herein, the electrical power supply was configured to provide the isolation electrode with a potential identical to that of the back electrode.

Power-Supply to Anode

As noted above, in some embodiments an electron gun according to the teachings herein comprises an anode. In some embodiments, the electrical power supply is functionally associated with an anode (e.g., through electrical leads) and in some such embodiments is configured to provide a DC potential to the anode.

In some embodiments, the electrical power supply is configured to maintain the anode within ±1000 V of ground, within ±500 V of ground, within ±200 V of ground, within ±100 V of ground, within ±50 V of ground and in some embodiments at ground.

In an experimental prototype of an electron gun according to the teachings herein, the power supply was configured to maintain the anode at ground.

Power Supply to Sub-Anode

As noted above, in some embodiments an electron gun according to the teachings herein comprises a sub-anode. In some such embodiments, the electrical power supply is functionally associated with the sub-anode (e.g., through electrical leads) and is configured to provide a DC potential to the sub-anode.

In some embodiments, the electrical power supply is configured to provide a DC potential to the sub-anode so that during application of an excitation potential pulse, the potential of the sub-anode is not less than 100 V, not less than 200 V, not less than 300 V and even not less than 600 V more positive than the potential applied to the isolation electrode. In some embodiments, during application of an excitation potential pulse the potential applied to the sub-anode is not more than 1000 V more positive than the potential applied to the isolation electrode. In an experiment described herein, during application of an excitation potential pulse the potential applied to the sub-anode electrode was 600 V more positive than the potential applied to the isolation electrode.

In some embodiments, the sub-anode comprises two parts and the electrical power supply is configured to provide a different potential to each one of the two parts. Typically, the difference between the two provided potentials is not greater than 100 V, and in some embodiments, not greater than 80 V and even not greater than 60 V.

In an experimental prototype of an electron gun according to the teachings herein, the power supply was configured to provide the sub-anode with a potential 600 V more positive that the potential of the isolation electrode.

Holder

In some embodiments, an electron gun according to the teachings herein further comprises a holder that holds one or more of the above-discussed components (e.g., the paraelectric cathode) of the electron gun in a fixed orientation, preferably a proper fixed orientation, proper indicating an orientation/relative orientation that allows the component to be properly used to produce an electron beam in accordance with the teachings herein. Typically, a holder fixedly holds at least two of the above-discussed components in a proper fixed relative orientation one to the other. Typically, the holder is not electrically conductive. For example, in some embodiments, a holder holds the isolation electrode in proper fixed orientation relative to the paraelectric cathode and electrically isolated from the front electrode. In an experimental prototype of an electron gun according to the teachings herein, a holder was made of electrically-insulating ABS (acrylonitrile butadiene styrene), substantially a hollow cylinder that held the paraelectric cathode, the isolation electrode, the isolation electrode lead, and the front electrode lead in a proper fixed relative orientation one to the other, and electrically isolating the front electrode from the isolation electrode.

Figure 2A:
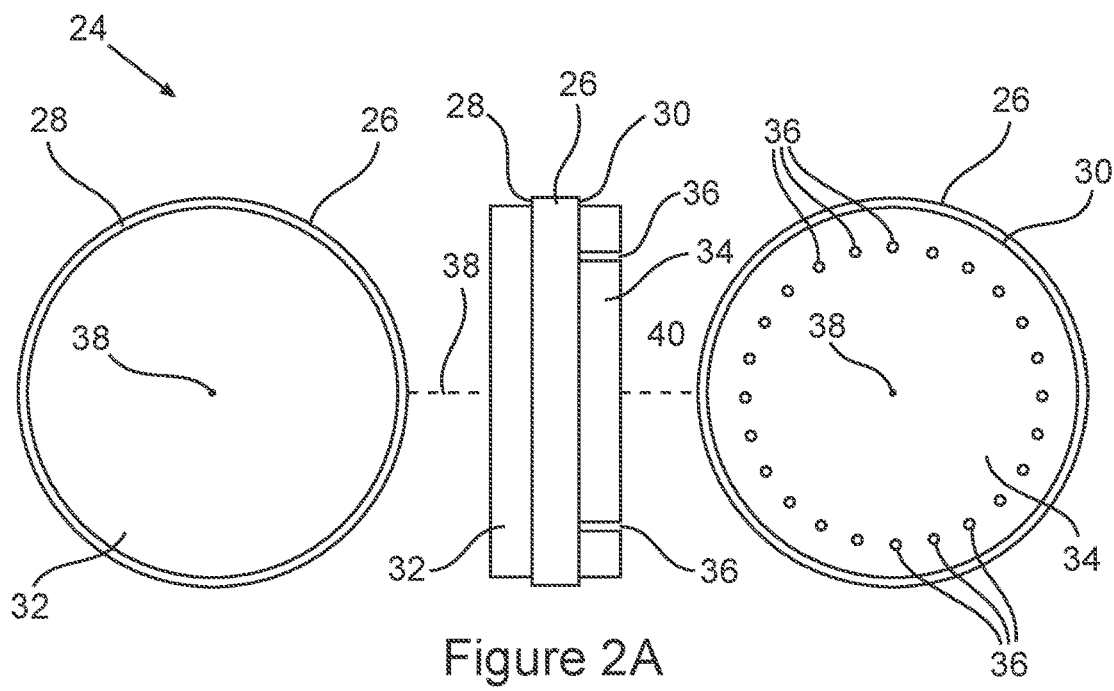
FIG. 2A is a schematic depiction of rear, side cross-section, and front views of an embodiment of a paraelectric cathode according to the teachings herein.

FIG. 2A is a schematic depiction of front, side cross-section, and rear views of an embodiment of a paraelectric cathode 24 according to the teachings herein. Paraelectric cathode 24 includes a paraelectric layer 26 made of a paraelectric material having a planar proximal face 28 and a planar distal face 30, paraelectric layer 26 sandwiched between a back electrode 32 on proximal face 28 and a front electrode 34 on distal face 30.

Paraelectric layer 26 is a 2 mm-thick, 18 mm-diameter disk of paraelectric-phase barium titanate ($BaTiO_3$) ceramic that is also ferroelectric, having a relative permittivity of about 1200-10000.

Both back electrode 32 and front electrode 34 are 17.5 mm-diameter 0.064 mm-thick disks of copper cut from adhesive-backed copper tape that are secured to the respective faces 28 and 30 of paraelectric layer 26 with the 0.036 mm-thick tape adhesive layer. Accordingly, back electrode 32 and front electrode 34 contact respective faces 28 and 30 through an intervening adhesive layer having a thickness of 0.036 mm.

Passing completely through front electrode 34 are twenty-seven 600-micrometer diameter (~1900 micrometer circumference) circular holes 36 arranged in a 13-mm diameter ring pattern which is centered around a central axis 38 of paraelectric cathode 24, each hole 36 approximately 1.5 mm from two neighboring holes 36. Holes 36 provide fluid communication between distal face 30 and a volume 40 that is distal to front electrode 34. Holes 36 are made by piercing the copper tape that constitutes the incipient front electrode 34 with a 600 micrometer diameter needle prior to adhering front electrode 34 to distal face 30 of paraelectric layer 26. As a result, the walls of each hole 36 are perpendicular to the surface of distal face 30.

In the embodiment discussed above with reference to FIG. 2A, back electrode 32 and front electrode 34 contact respective faces 28 and 30 of paraelectric layer 26 through an intervening adhesive layer. In some embodiments, a back electrode and/or a front electrode directly contact a respective face of a paraelectric layer. For example, some such embodiments are made by deposition of a conductive material (e.g., vapor deposition) such as Ag, Au, Cu or Al to a face of a paraelectric layer constituting at least a portion of the electrode and, optionally, an additional layer of conductive material is added thereto (for example by welding) to thicken the electrode.

In the embodiment discussed above with reference to FIG. 2A, the shape of each hole 36 is a circle. In some embodiments, holes have a different shape, preferably a shape devoid of vertices such as an oval or ovoid.

In the embodiment discussed above with reference to FIG. 2A, each hole 36 is substantially a hollow cylinder that has parallel walls that are substantially perpendicular to distal face 30, i.e., the surface of paraelectric layer 26. In some embodiments, the walls of one or more holes are not parallel, for example, outwardly diverge from distal face 30 towards the volume 40, for example, the hole is a truncated cylinder. Such holes are made, for example, by piercing an incipient front electrode with the convergent portion of a pointed tool such as a needle.

In the embodiment discussed above with reference to FIG. 2A, the paraelectric material from which paraelectric layer 26 was made is ferroelectric $BaTiO_3$. In some embodiments, the paraelectric material from which paraelectric layer is made is not ferroelectric.

Figure 2B:
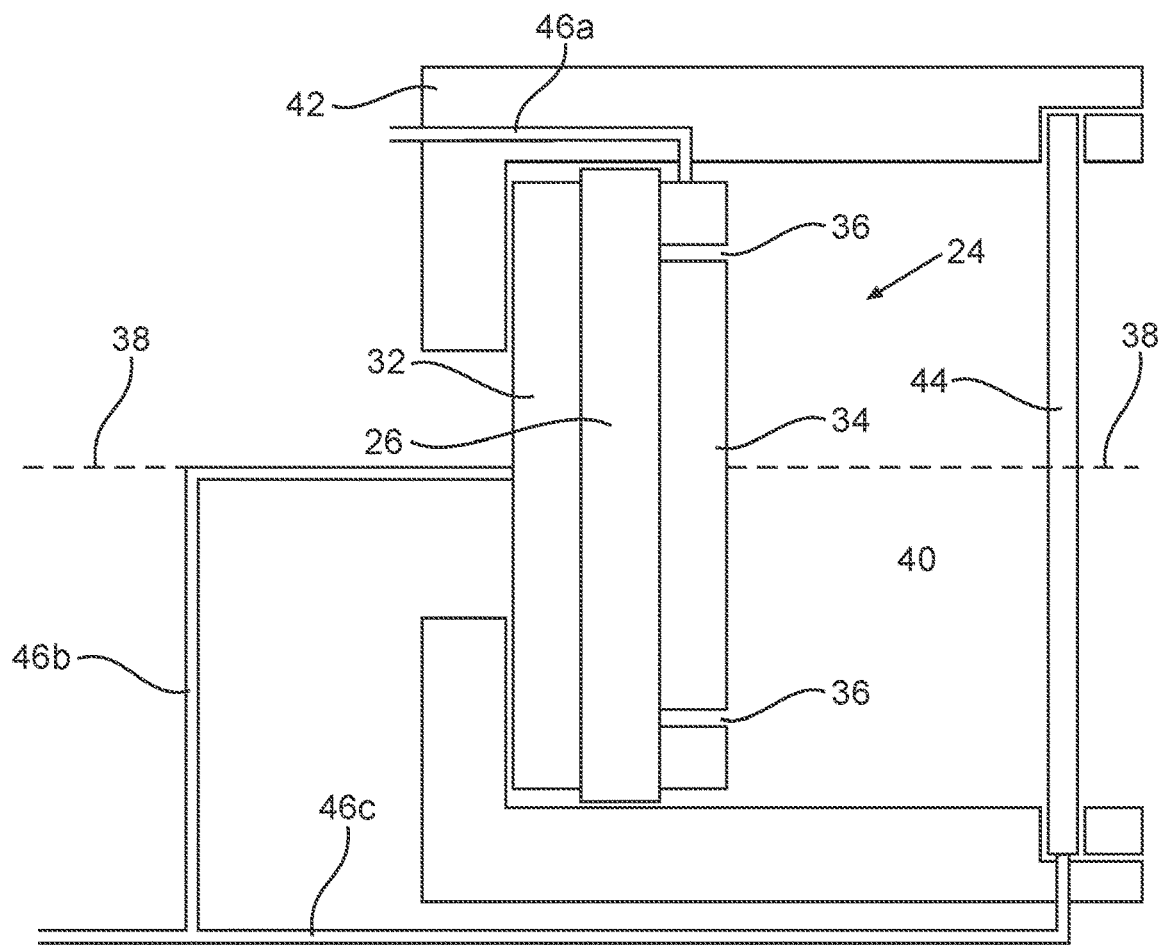
FIG. 2B is a schematic depiction of a paraelectric cathode functionally associated with electrical leads and held in a holder, according to an embodiment of the teachings herein in side cross-section.

FIG. 2B is a schematic depiction of paraelectric cathode 24 held in a holder 42 in a proper fixed orientation for installation in an electron gun and in a proper fixed orientation relative to an isolation electrode 44.

Holder 42 is substantially a 20 mm-long 25 mm-outer diameter hollow cylinder of ABS that also electrically insulates paraelectric cathode 24 from isolation electrode 44.

Isolation electrode 44 is a 0.3 mm-thick copper grid made by laser-cutting of a 0.3 mm-thick copper sheet held in place 9 mm from front electrode 34, the grid defining a plane. Isolation electrode 44 is held in holder 42 so as to be parallel to distal face 30 of paraelectric layer 26 and perpendicular to and concentric with central axis 38, so that the plane defined by the grid is also perpendicular to central axis 38.

Holder 42 further holds a number of electrical leads 46 that are functionally associated with other components. Specifically, holder 42 holds lead 46a that is functionally associated with front electrode 34, lead 46b that is functionally associated with back electrode 32, and lead 46c that is functionally associated with isolation electrode 44. As seen in FIG. 2B, leads 46b and 46c are together configured to simultaneously provide a same potential to back electrode 32 and isolation electrode 44.

In the embodiment discussed above with reference to FIG. 2B, leads 46b and 46c are together configured to simultaneously provide a same potential to back electrode 32 and isolation electrode 44. In some embodiments, the respective leads (and, if necessary, other components) are configured to allow optionally providing the respective electrodes with different potentials.

In the embodiment discussed above with reference to FIG. 2B, isolation electrode 44 is a planar component oriented perpendicularly to central axis 38, specifically, a 0.3 mm thick copper grid. In some embodiments, an isolation electrode has a different shape, for example a ring or cylinder (in some embodiments, being concentric with central axis 38). In some embodiments, an isolation electrode is made of a different suitable material, e.g., stainless steel.

Figure 3:
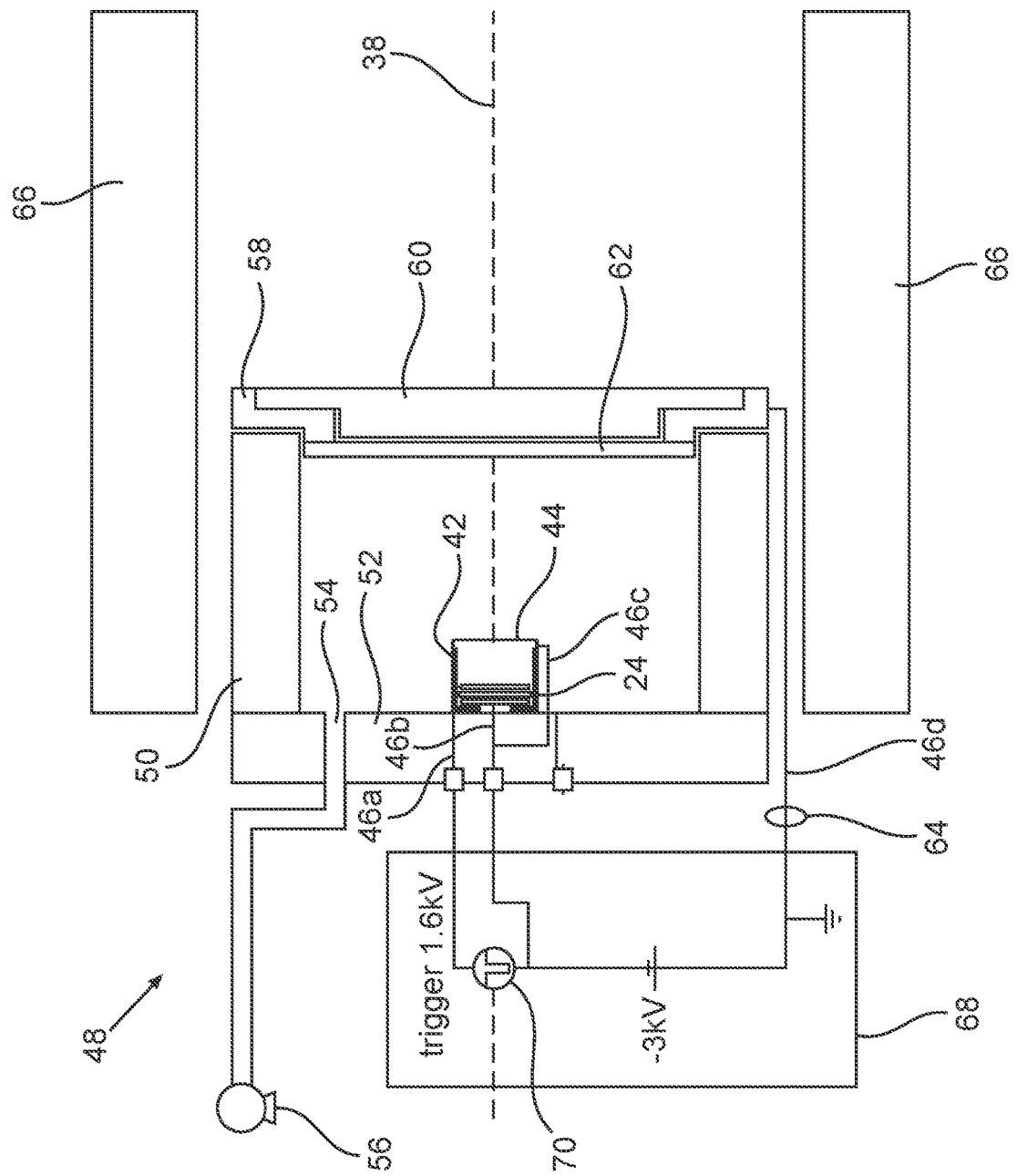
FIG. 3 is a schematic depiction in side cross-section of an electron gun including a paraelectric cathode according to an embodiment of the teachings herein, configured for production of a relatively low-energy electron beam.

FIG. 3 is a schematic depiction in side cross-section of an electron gun 48 including paraelectric cathode 24, configured for production of a relatively low-energy electron beam. Electron gun 48 includes a sealed electron gun body 50, substantially a 10 cm-long 6"-diameter ceramic cylinder.

The proximal end of electron gun body 50 is sealed with a ceramic body base 52 through which pass a pumping port 54 and sealed passages for electrical leads 46. Functionally associated with the internal volume defined by electron gun body 50 through pumping port 54 is rotary vacuum pump 56, thereby configured to evacuate the internal volume.

The distal end of electron gun body 50 is sealed with a copper flange anode 58 that supports a quartz window 60. Copper flange anode 58 is configured to serve as an anode for electron gun 48 by functional association with electrical lead 46d that grounds anode 58.

A phosphor screen 62 is located inside the internal volume defined by electron gun body 50, 5 cm from isolation electrode 44.

A Rogowski coil 64 is placed around electrical lead 46d in order to measure the current of electrons produced by electron gun 48.

In FIG. 3, the distal end of electron gun 48 is depicted inside the proximal end of a gun solenoid 66 having a 20 cm-long 6.5"-diameter bore.

Leads 46 are connected to a power supply 68. Lead 46d is grounded so that anode 58 is grounded. Power supply 68 is configured to provide back electrode 32, front electrode 34 and isolation electrode 44 with a continuous desired rest potential (typically not less than −500 V different from the potential of anode 58, for some experiments −3 kV different from grounded anode 58) through leads 46a, 46b and 46c. As a result, the absolute value of the potential difference between front electrode 34 and back electrode 32 is substantially 0 V.

Back electrode 32 and isolation electrode 44 are functionally associated with a fast high-voltage switch 70 of power supply 68 through leads 46b and 46c. In such a way, when activated, power supply 68 provides an excitation potential pulse as described herein to back electrode 32 and to isolation electrode 44. Typically, the duration of an excitation potential pulse is not greater than 2.5 microseconds (e.g., from 50 nanoseconds to 2.5 microseconds). Typically, during application of an excitation potential pulse, the absolute value of the potential difference between front electrode 34 and back electrode 32 is increased to not less than 300 V greater than the electrode rest potential difference value at a rate not slower than 6 V/nanosecond, thereby generating plasma in holes 36 of front electrode 34. The absolute value of the potential difference between front electrode 34 and back electrode 32 is maintained for the remaining duration of the pulse, thereby maintaining the generated plasma in hole 36, typically for a period of not less than 50 nanoseconds. As discussed in the experimental section, the power supply that was actually used in the experiments, was used to provide an excitation potential pulse to back electrode 32 and to isolation electrode 44 having a 300 nanosecond duration and 1.6 kV different (more positive) than the potential of front electrode 34. Power supply 68 is configured to provide a single excitation potential pulse or, optionally, a train of successive excitation potential pulses, each such train comprising two or more excitation potential pulses of a specified duration (during which plasma is generated and maintained in holes 36) separated by a rest period of a specified duration (during which plasma is not generated in holes 36). Power supply 68 is configured to provide a train of square wave excitation potential pulses that is unipolar or bipolar, as desired by the operator.

Figure 4:
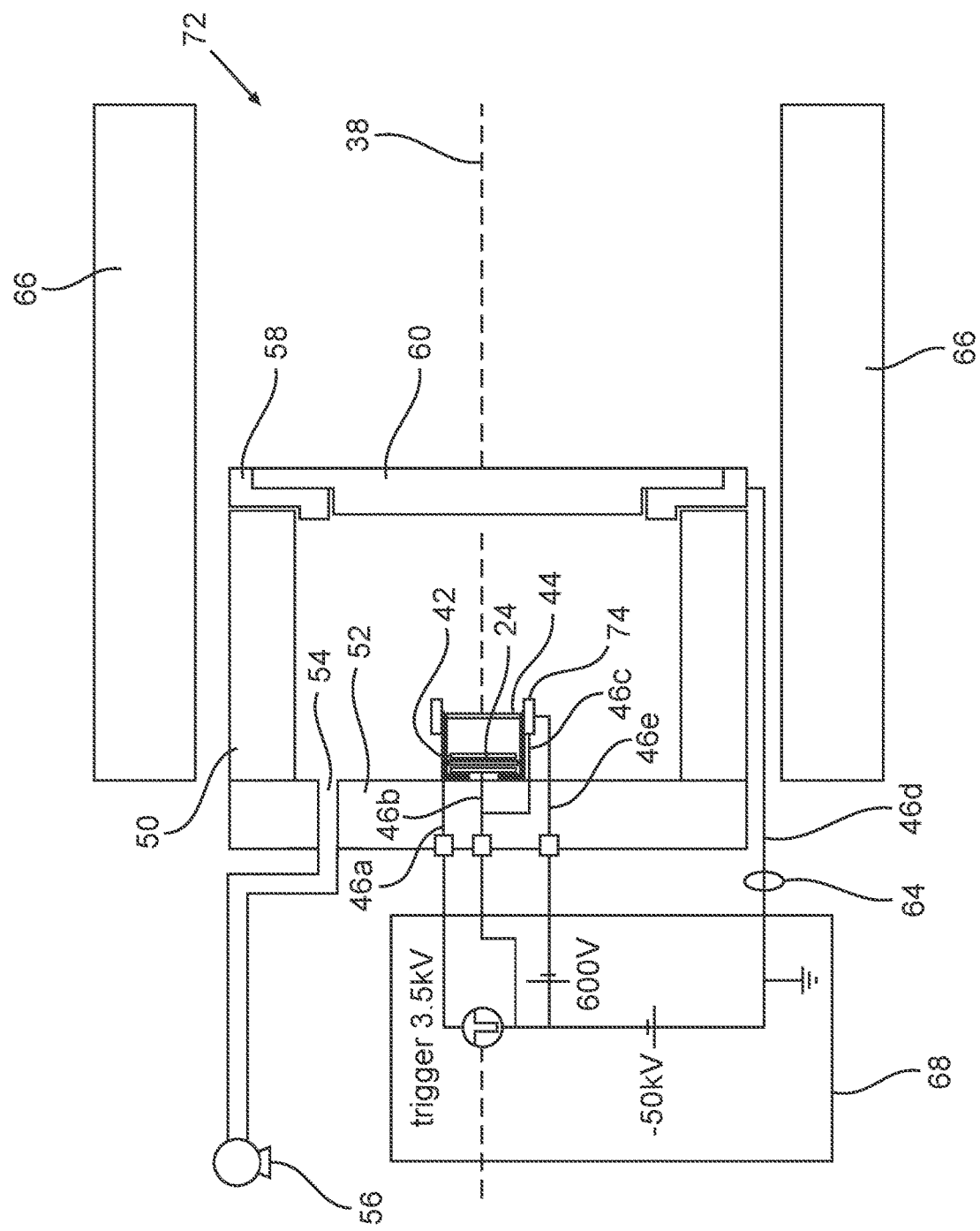
FIG. 4 is a schematic depiction in side cross-section of an electron gun including a paraelectric cathode according to an embodiment of the teachings herein, configured for production of a relatively high-energy electron beam.

FIG. 4 is a schematic depiction in side cross-section of an electron gun 72 including paraelectric cathode 24, configured for generation of a relatively high-energy electron beam. Electron gun 72 is identical to electron gun 48 with three substantial differences.

A first substantial difference is that that power supply 68 is configured to provide a continuous −50 kV rest potential (instead of a −3 kV rest potential) different from grounded anode 58 to back electrode 32, front electrode 34 and isolation electrode 44 and, on activation, a 300 nanosecond-duration excitation potential pulse to back electrode 32 and isolation electrode 44 that is 3.5 kV (instead of 1.6 kV) different (more positive) than the potential of back electrode 32.

A second substantial difference is that electron gun 72 is devoid of phosphor screen 62: the intensity of the produced electron beam is such that a phosphor screen is damaged and quartz window 60 emits light when the electrons impinge on the respective components.

A third substantial difference is that electron gun 72 comprises a sub-anode 74 functionally associated with power supply 68 through electrical lead 46*e*. Power supply 68 is configured to provide a continuous DC potential to sub-anode 74 of not less than 100V different (more positive) than the potential of isolation electrode 44. Experimentally, power supply 68 was configured to provide a continuous DC potential to sub-anode 74 so that the potential of sub-anode 74 was 600 V more positive than isolation electrode 44. In electron gun 72, sub-anode 74 is a 3 mm thick copper cylinder that encircles the distal end of holder 42, and protrudes approximately 5 mm distally from isolation electrode 44.

In the embodiments discussed above with reference to FIG. 4, sub-anode 74 is a single cylindrical component that is maintained at a single potential. In some embodiments, a sub-anode is of a different shape, e.g., a grid, a ring, a rod or sheet or at least two rods or at least two sheets. In some embodiments, a sub-anode of an electron gun according to the teachings herein comprises at least two portions that are optionally maintained at different potentials one from the other.

In the embodiments discussed above with reference to FIGS. 3 and 4, anode 58 is a single ring-shaped component that is maintained at a single potential. In some embodiments, an anode is of a different shape, e.g., a grid, a ring, a rod or sheet or at least two rods or at least two sheets. In some embodiments, an anode of an electron gun according to the teachings herein comprises at least two portions that are optionally maintained at different potentials one from the other.

The embodiments discussed above with reference to FIGS. 2, 3 and 4 are configured to produce an electron beam having an annular cross section by the arrangement of individual holes 36 in a circular ring pattern through front electrode 34. As noted above, in some embodiments electron beams having differently-shaped cross sections are produced in accordance with the teachings herein by arrangement of one or more individual holes in a predetermined pattern through front electrode 34.

Figure 5A:
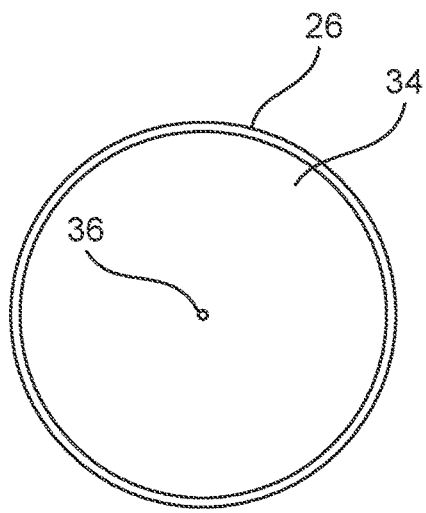
FIGS. 5A-5E are schematic depictions of front views of embodiments of a paraelectric cathodes according to the teachings herein.
Figure 5B:
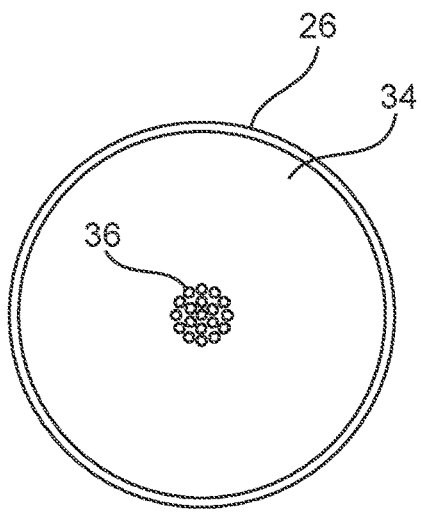
Figure 5C:
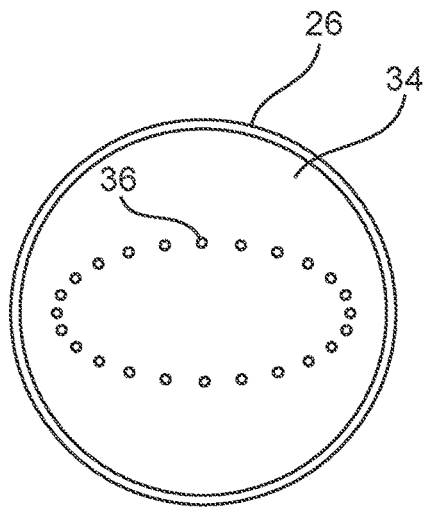
Figure 5D:
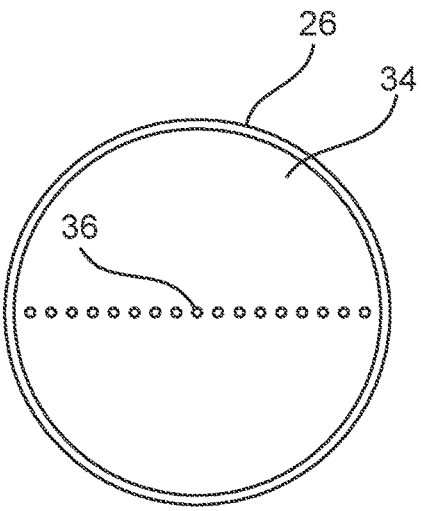
Figure 5E:
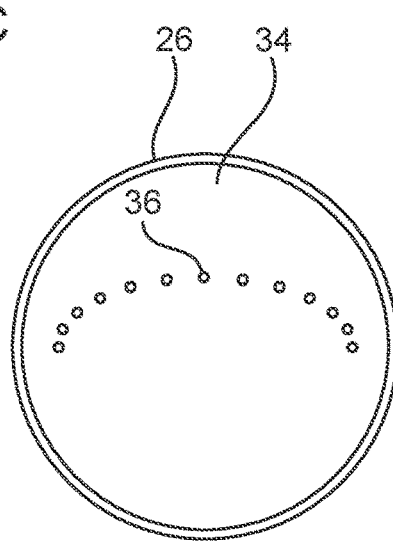

FIG. 5 are schematic depictions of front views of embodiments of paraelectric cathodes according to the teachings herein configured for production of electron beams having various cross-sections:

in FIG. 5A, a front electrode with a single hole 36 for producing a narrow circular-cross section electron beam;

in FIG. 5B, a front electrode with many holes 36 arranged in a filled circular pattern for producing a broad circular-cross section electron beam;

in FIG. 5C, a front electrode with many holes 36 arranged in a hollow oval pattern for producing a hollow oval cross section electron beam;

in FIG. 5D, a front electrode with many holes 36 arranged in a straight line pattern for producing an electron beam in the form of a flat sheet with a linear cross section; and in FIG. 5E, a front electrode with many holes 36 arranged in a curved line pattern for producing an electron beam in the form of a curved sheet with a curved linear cross section.

As is clear to a person having ordinary skill in the art upon perusal of the description herein, some embodiments of a paraelectric cathode as described above having a particular pattern of holes on the front electrode are preferably provided with an anode and/or sub-anode and/or isolation electrode having a particular physical shape or potential, thereby providing one or more advantages during operation.

Electron Gun as Component of a Device or System

In some embodiments, an electron gun according to the teachings herein is a component of a device, where the electron gun is typically used for producing an electron beam which at least one property of the produced beam is subsequently changed by some other component of the device. In some embodiments, the device is selected from the group consisting of a radiation-generating device, an image-forming device and a physical-change device.

Thus, according to an aspect of some embodiments of the teachings herein, there is provided a device comprising:

an electron gun according to the teachings herein; and a component to controllably change at least one property (e.g., focus, dimensions, intensity) of an electron beam produced by the electron gun. In some embodiments, the device is selected from the group consisting of an image-forming device, a physical-change device, and a radiation-generating device.

In some embodiments, the device is an image-forming device. In some such embodiments, the device is selected from the group consisting of a cathode-ray tube, a display, a computer monitor, a television, a radar screen and an oscilloscope.

In some embodiments, the device is a physical-change device, i.e., a device that causes a permanent physical or chemical change in a material/workpiece. In some such embodiments, the device is selected from the group consisting of;

an electron beam lithography system (where the physical change is forming a lithographic image);

an electron beam sterilization system (where the physical change is the destruction of pathogens and microorganisms);

an electron beam welding system (where the physical change is the welding of at least one workpiece);

an electron beam machining system (where the physical change is vaporization of a portion of a workpiece); and an electron beam melting system (where the physical change is melting of feedstock, e.g., metal powder or particles to form an object)

In some embodiments, the device is a radiation-generating device, i.e., a device generates radiation from electrons. In some such embodiments, the device is selected from the group consisting of a gyrotron, a magnetron, a klystron, a travelling-wave tube and an electron-beam tomograph.

Gyrotron

Of particular interest is the use of an electron gun according to the teachings herein as a component of a gyrotron to produce an electron beam that is used to drive the gyrotron tube. As known in the art, optimal operation of a gyrotron requires provision of an electron beam with an annular cross section [G. Rosenman, D. Shur, Y. Krasik and A. Dunaevsky, "Electron emission from ferroelectrics," Journal of Applied Physics, vol. 88, no. 11, pp. 6109,6161, December 2000]. Beam properties such as current, emission uniformity [M. Einat, E. Jerby and G. Rosenman, "Spectral measurements of gyrotron oscillator with ferroelectric electron gun," Applied Physics Letters, vol. 81, no. 7, pp. 1347-9, August 2002], electron beam misalignments [M. Einat, E. Jerby and G. Rosenman, "High-repetition-rate ferroelectric-cathode gyrotron," Applied Physics Letters, vol. 79, no. 25, pp. 4097-9, December 2001] and beam thickness [M. Einat, E. Jerby and G. Rosenman, "A ferroelectric electron gun in a free-electron maser experiment," Nuclear Instruments & Methods in Physics Research, Section A (Accelerators, Spectrometers, Detectors and Associated Equipment), vol. 483, no. 1-2, pp. 326-30, May 2002] all have a significant influence on gyrotron operation. Typically, thermionic cathodes are used to generate an electron beam to drive gyrotrons. Disadvantages of thermionic cathodes to drive gyrotrons include vacuum requirements ($10^{-8}$-$10^{-9}$ mbar), long activation procedure before operation as well as the required close proximity of the hot cathode and the cold gyrotron solenoid [V. Engelko, "Formation of stable long pulse electron beams with the help of explosive emission cathodes," Plasma Devices and Operations, vol. 13, no. 2, pp. 135-142, June 2005].

As described herein and as experimentally demonstrated, the teachings herein allow generation of a stable, long-lasting and high intensity electron beam having an annular cross section with relatively thin "walls" which diameter can be changed without adversely affecting the annular shape of the electron beam. A paraelectric cathode according to the teachings herein operates at low temperatures and at pressures at least as high as $10^{-4}$ mbar. The radius of the annular electron beam is controllable, for example, with the use of a magnetic field, allowing an electron beam generated according to the teachings herein to be modified for use with a specific gyrotron.

Figure 6:
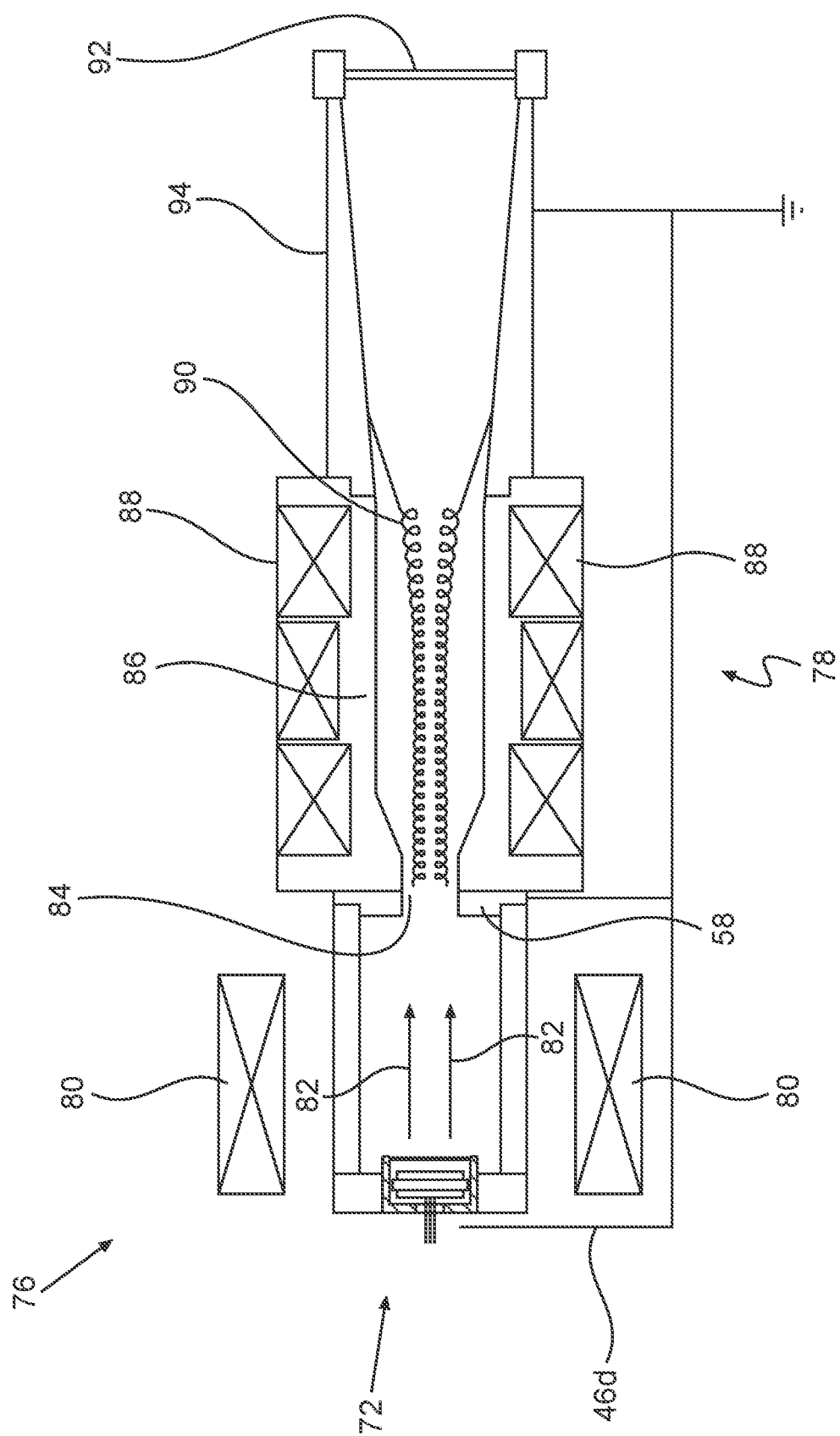
FIG. 6 is a schematic depiction of an embodiment of a gyrotron tube driven by the electron gun of FIG. 4.

Accordingly, in some embodiments of the teaching herein, an electron gun according to the teachings herein is used to drive a gyrotron tube to generate radiation. FIG. 6 is a schematic depiction of an embodiment of a gyrotron 76 in side cross-section driven by electron gun 72 of FIG. 4.

Gyrotron 76 comprises a gyrotron tube 78 driven by electron gun 72 of FIG. 4, and including a tube solenoid 80 to generate an axial magnetic field. As known in the art, during operation of a gyrotron the pressure inside gyrotron tube 78 is maintained at ~$10^{-6}$ mbar (~$10^{-4}$ Pa).

The operation of electron gun 72 and tube solenoid 80 is synchronized so that a produced electron beam 82 propagates through the magnetic field generated by tube solenoid 80.

During use of gyrotron 76, annular-cross section electron beam 82 generated by electron gun 72 as described above exits through gap 84 in anode 58 of electron gun 72 (through where quartz window 60 was located) and enters a cavity 86 of gyrotron tube 78, where the interaction between electron beam 82 and the gyrotron magnetic field generated by a tube solenoid 88 occurs in the usual way as known in the field of gyrotrons. During the interaction with the magnetic field generated by tube solenoid 88, the electrons of electron beam 82 are forced to adopt cyclotron motion 90 in the strong magnetic field, thereby generating electromagnetic radiation of a desired frequency. The generated electromagnetic radiation is emitted through an output window 92 (e.g., of polytetrafluorethylene, e.g., Teflon® by DuPont) while the electrons impact electron collector 94 (that, like anode 58 of electron gun 76, is grounded) that is configured to dissipate heat and charge generated during gyrotron operation.

Method of Producing an Electron Beam

As noted above, some embodiments of the teachings herein disclose methods of producing electron beams using a paraelectric cathode according to an embodiment of the teachings herein.

According to an aspect of some embodiments of the invention there is provided a method of producing an electron beam, comprising:

a. providing an electron gun according to the teachings herein;
b. during a rest period, maintaining the back electrode at a back electrode rest potential and the front electrode at a front electrode rest potential, both rest potentials not less than −500 V different from an anode potential (the potential of the anode), wherein the electrode rest potential difference value (the absolute value of the difference between the back electrode rest potential and the front electrode rest potential) is not greater than 200 V;
c. applying at least one excitation potential pulse having a duration not greater than 2.5 microsecond to the paraelectric cathode, wherein:
  i. during the application of the excitation potential pulse, increasing the absolute value of the potential difference between the front electrode and the back electrode to not less than 300 V greater than the electrode rest potential difference value at a rate not slower than 6 V/nanosecond, thereby generating plasma in the at least one hole of the front electrode,
  ii. subsequent to 'i', maintaining the generated plasma in the at least one hole for a period of not less than 50 nanoseconds, and
  iii. subsequent to 'ii', extinguishing the plasma by reducing the value of the potential difference between the front electrode and the back electrode; and
d. during 'c', extracting electrons from the generated plasma towards the anode as a beam of electrons.

Electrode Rest Potential Difference Value

As noted above, in some embodiments during a rest period (a period of time immediately prior to application of an excitation potential pulse), the back electrode is maintained at a back electrode rest potential and the front electrode is maintained at a front electrode rest potential, both rest potentials not less than −500 V different from an anode potential (the potential of the anode), wherein the absolute value of the difference between the back electrode rest potential and the front electrode rest potential (electrode rest potential difference value) is not greater than 200 V.

In some embodiments, the back electrode rest potential is greater than the front electrode rest potential. In some embodiments, the back electrode rest potential is less than the front electrode rest potential. In some embodiments, the electrode rest potential difference value is not greater than 200V, not greater than 150V, not greater than 100V, not greater than 50V and even not greater than 25V.

In some embodiments, during a rest period the back electrode rest potential and the front electrode rest potential are substantially the same, that is to say, the electrode rest potential difference value is substantially 0 V.

Excitation Potential Pulse Rate and Magnitude

As noted above, in some embodiments, during application of an excitation potential pulse, plasma is generated in at least one hole of the front electrode of the paraelectric cathode by increasing the absolute value of the potential difference between the front electrode and the back electrode to not less than 300 V greater than the electrode rest potential difference value at a rate not slower than 6 V/nanosecond.

In some embodiments, the rate of increase of the absolute value of the potential difference between the front electrode and the back electrode is not slower than 10 V/nanosecond, not slower than 15 V/nanosecond and even not slower than 20 V/nanosecond.

In some embodiments, the at least one excitation potential pulse is such that during application of the excitation potential pulse, the absolute value of the potential difference between the front electrode and the back electrode is increased to not less than 500 V, not less than 700 V, not less than 1000 V, not less than 1200 V and even not less than 1400 V greater than the electrode rest potential difference value. In some embodiments, especially embodiments configured for producing high-energy electron beams, the at least one excitation potential pulse is such that during application of the excitation potential pulse, the absolute value of the potential difference between the front electrode and the back electrode is increased to not less than 2000 V, not less than 2500 V and even not less than 3000 V. In an experiment described herein, the excitation potential pulse applied was such that the absolute value of the potential difference between the front electrode and the back electrode is increased to 1.6 kV, and in another embodiment to 3.5 kV.

In some embodiments, the increase of the absolute value of the potential difference between the front electrode and the back electrode is achieved by increasing the potential of the front electrode (so that the front electrode is at a less negative potential than the back electrode relative to the anode), in some such embodiments, while maintaining the potential of the back electrode substantially constant.

In some embodiments, the increase of the absolute value of the potential difference between the front electrode and the back electrode is achieved by decreasing the potential of the front electrode (so that the front electrode is at a more negative potential than the back electrode relative to the anode), in some such embodiments, while maintaining the potential of the back electrode substantially constant.

In some embodiments, the increase of the absolute value of the potential difference between the front electrode and the back electrode is achieved by increasing the potential of the back electrode (so that the front electrode is at a more negative potential than the back electrode relative to the anode), in some such embodiments, while maintaining the potential of the front electrode substantially constant.

In some embodiments, the increase of the absolute value of the potential difference between the front electrode and the back electrode is achieved by decreasing the potential of the back electrode (so that the front electrode is at a less negative potential than the back electrode relative to the anode), in some such embodiments, while maintaining the potential of the front electrode substantially constant.

In some embodiments, the increase of the absolute value of the potential difference between the front electrode and the back electrode is achieved by increasing the potential of the back electrode while decreasing the potential of the front electrode (so that the front electrode is at a more negative potential than the back electrode relative to the anode).

In some embodiments, the increase of the absolute value of the potential difference between the front electrode and the back electrode is achieved by increasing the potential of the front electrode while decreasing the potential of the back electrode (so that the front electrode is at a less negative potential than the back electrode relative to the anode).

Excitation Potential Pulse Duration

As noted above, in some embodiments the duration of an excitation potential pulse is not greater than 2.5 microsecond.

In some embodiments, the duration of an applied excitation potential pulse is not more than 2 microseconds, not more than 1.5 microseconds and even not more than 1 microsecond. Although it is believed that excitation potential pulses of between 1 microsecond up to 2.5 microseconds may be used, it is currently believed that trains of excitation potential pulses longer than 1 microsecond lead to a relatively low duty cycle.

In some embodiments, the duration of an applied excitation potential pulse is not less than 50 nanoseconds, not less than 75 nanoseconds and in some embodiments not less than 100 nanoseconds. It is currently believed that excitation potential pulses shorter than 100 nanoseconds generate a relatively modest amount of plasma and therefore lead to production of a relatively low electron current.

In some embodiments, the duration of an excitation potential pulse is not less than 100 nanosecond and not more than 1 microsecond and even not more than 800 nanoseconds. In some embodiments that are particularly suitable for use in generating electromagnetic radiation (e.g., useful for driving a gyrotron), the duration of an excitation potential pulse is not less than 200 nanosecond and not more than 500 nanoseconds. In an experiment described herein, an excitation potential pulse having a duration of 300 nanoseconds was applied according to the teachings herein.

Train of Excitation Potential Pulses

In experiments described herein, a single excitation potential pulse was applied during any given experiment in order to study the characteristics of the studied electron gun prototypes.

In some embodiments, it is desirable that an electron beam having a relatively long duration be produced. In some such embodiments, such a long duration is achieved by applying a train of successive excitation potential pulses separated by rest periods (in some preferred embodiments during which the front and back electrodes are maintained at a respective rest potential) to the paraelectric cathode.

Accordingly, in some embodiments the at least one excitation potential pulse comprises a train of at least two successive excitation potential pulses within a period of 1 millisecond, each individual excitation potential pulse as described above, the train comprising a rest period between any two successive excitation potential pulses.

In some embodiments, a train of successive excitation potential pulses comprises not less than four successive excitation potential pulses, not less than eight successive excitation potential pulses and even not less than sixteen successive excitation potential pulses within a period 1 millisecond.

In some embodiments, at least one, preferably all rest periods, have a duration of not less than 100 nanoseconds. Without wishing to be held to any one theory, it is currently believed that not less than 100 nanoseconds are required for a paraelectric electrode according to the teachings herein to recover from an excitation potential pulse.

In some embodiments, at least one, preferably all, rest periods have a duration that is not shorter than the duration of a preceding excitation potential pulse. Without wishing to be held to any one theory, it is currently believed that a paraelectric electrode according to the teachings herein requires a rest period that has a duration at least as long as a preceding excitation potential pulse to recover from the excitation potential pulse.

In some embodiments, a rest period has a duration that is of substantially the same duration as that of a preceding excitation potential pulse allowing a duty cycle of 50%, typically suitable when the duration of the preceding excitation potential pulse is up to 500 nanoseconds.

In some embodiments, typically embodiments where the duration of the excitation potential pulses are greater than 1 microsecond or even greater than 500 nanoseconds, at least one, preferably all, rest periods have a duration that is greater than the duration of a preceding excitation potential pulse.

In some embodiments, the train of excitation potential pulses is unipolar. In some embodiments, the train of excitation potential pulses is bipolar.

In some embodiments, the waveform of the train of excitation potential pulses is selected from the group consisting of a square wave, a pulse wave and a sawtooth wave.

Rest Potential Magnitude

As noted above, in some embodiments during a rest period, the back electrode and the front electrode are each maintained at a respective rest potential, both rest potentials not less than −500 V different from an anode potential, that is to say, both the back electrode and the front electrode are more negative than the anode with an absolute value of 500 V or greater.

In some embodiments, the rest potentials are applied continuously. In some embodiments, the rest potentials are more negative than −500 V in order to generate a higher-energy electron beam. In some embodiments, the rest potentials are not less than −1000 V, not less than −2000 V, and even not less than −2500 V different from the anode potential. In some embodiments, especially embodiments configured for producing high-energy electron beams, the rest potentials are is not less than −2.4 kV, not less than −5 kV, not less than −10 kV, not less than −20 kV, and even not less than −30 kV different from the anode potential. In an experimental embodiments described herein, both rest potentials were −3 kV different from the anode potential, and in another experimental embodiment both rest potentials were −50 kV different from the anode potential.

In some embodiments, the anode potential is maintained within ±1000 V of ground, within ±500 V of ground, within ±200 V of ground, within ±100 V of ground, within ±50 V of ground and in some embodiments at ground. In an experiment described herein, the anode potential was maintained at ground.

Holes of the Front Electrode

As noted above, the front electrode of a paraelectric cathode of an electron gun used for implementing the teachings herein typically includes at least one hole, the hole providing fluid communication between the distal face of the paraelectric layer and a volume distal to the front electrode.

In some embodiments, the at least one hole comprises at least two holes arranged in a predetermined pattern on the front electrode, and the electron beam produced thereby has a cross sectional shape corresponding to the predetermined pattern. In some embodiments, the at least two holes arranged in a predetermined pattern are at least three holes, at least four holes, at least six holes, at least eight holes and even at least twelve holes arranged in a predetermined pattern. In some embodiments, the predetermined pattern is selected from the group consisting of a line, a solid closed curve and a hollow closed curve.

In some embodiments, the predetermined pattern is a straight line and the produced electron beam is planar having a straight-line cross section.

In some embodiments, the predetermined pattern is a curved line and the produced electron beam is a curved plane having a curved-line cross section.

In some embodiments, the predetermined pattern is a hollow closed curve, for example, selected from the group consisting of a circular ring, an oval ring, an ovoid ring, a triangular ring and a square ring and the produced electron beam is tubular, in cross section having a low electron-density center with a high electron-density "wall", the "wall" having a cross sectional shape that corresponds to the predetermined pattern.

In an experimental embodiment described herein, the twenty-seven holes in the front electrode were arranged in a predetermined pattern that was a hollow circular ring, and the electron beam produced thereby was tubular having an annular cross sectional shape.

Isolation Electrode

As noted above, extraction of electrons from the plasma generated in the holes of the front electrode and formation of an electron beam therefrom can be improved by the presence of an isolation electrode in the volume between the front electrode and the anode.

Thus, in some embodiments, the electron gun further comprises an isolation electrode in the volume between the front electrode and the anode (in some embodiments, as described above with reference to an electron gun according to the teachings herein), and the method further comprises: during application of the excitation potential pulse, maintaining the isolation electrode at a potential that is not less than 100 V more positive than the potential of the front electrode.

In some embodiments, during application of the excitation potential pulse the isolation electrode is maintained at a potential that is not less than 200 V, not less than 300 V, not less than 400 V and even not less than 500 V more positive than the potential of the front electrode.

In some embodiments, the potential of the isolation electrode is constant during both the rest period and during application of the excitation potential pulse. In some embodiments, the potential of the isolation electrode is changed.

In some embodiments, during application of the excitation potential pulse the potential of the isolation electrode is maintained to be not more than 1000 V, not more than 800 V, not more than 600 V, not more than 400 V and even not more than 200 V different from the potential of the back electrode.

In some embodiments, the potential applied to the isolation electrode during application of the excitation potential pulse is substantially identical to the potential applied to the back electrode.

In an experiment described herein, the potential applied to the isolation electrode was substantially identical to the potential applied to the back electrode, a configuration that is technically easy to make and operate, requiring fewer components such as leads and power supplies.

Specific Experimental Embodiments

In one experiment described herein for producing a low-energy electron beam, during the rest periods the front electrode rest potential and the back electrode rest potential were both maintained at the same −3 kV relative to the anode potential, so that the electrode rest potential difference value was substantially 0 V. The applied excitation potential pulse had a duration of about 300 nanoseconds and constituted maintaining the front electrode potential substantially constant relative to the anode potential, while increasing the potential of the back electrode by 1.6 kV to −1.4 kV relative to the anode potential within 50 nanoseconds (a rate of 28 V/nanosecond) so that the absolute value of the potential difference between the front electrode and the back electrode became 1.6 kV. The back electrode potential was then maintained at −1.4 kV relative to the anode potential for 250 nanoseconds to maintain the generated plasma in the holes. Subsequently, the back electrode potential was set back to the back electrode rest potential of −3 kV relative to the anode potential. To keep the electron gun simple and robust, the potential of the isolation electrode was kept substantially the same as that of the back electrode so that during a rest period the potential difference between the isolation electrode and the front electrode was substantially 0 V, while during the period when the generated plasma was maintained in the holes, the potential difference between the isolation electrode and the front electrode was +1.6 kV.

In another experiment described herein for producing a high-energy electron beam, during the rest periods the front electrode rest potential and the back electrode rest potential were both maintained at −50 kV relative to the anode potential, so that the electrode rest potential difference value was substantially 0 V. The applied excitation potential pulse had a duration of about 300 nanoseconds and constituted maintaining the front electrode potential substantially constant relative to the anode potential, while increasing the potential of the back electrode by 3.5 kV to −46.5 kV relative to the anode potential within 50 nanoseconds (a rate of 70 V/nanosecond) so that the absolute value of the potential difference between the front electrode and the back electrode became 3.5 kV. The back electrode potential was then maintained at −46.5 kV relative to the anode potential for 250 nanoseconds to maintain the generated plasma in the holes. Subsequently, the back electrode potential was set back to the back electrode rest potential of −50 kV relative to the anode potential. To keep the electron gun simple and robust, the potential of the isolation electrode was kept substantially the same as that of the back electrode so that during a rest period the potential difference between the isolation electrode and the front electrode was substantially 0 V, while during the period when the generated plasma was maintained in the holes, the potential difference between the isolation electrode and the front electrode was +3.5 kV Sub-Anode As discussed above, it has been found that, in some embodiments, when the potential difference between the electrode rest potentials and the anode is very high, for example, higher than 10 kV, there is an increased incidence of voltage breakdown while electrons are extracted from plasma generated in a hole of the front electrode. It has been found that positioning a sub-anode just distally from the isolation electrode reduces the incidence of voltage breakdown and also reduces the duration of the electron beam produced by a single excitation potential pulse to become almost equal to the duration of the excitation potential pulse. Without wishing to be held to any one theory, it is currently believed that such a sub-anode advantageously changes the electrical field between the front electrode and the anode.

Accordingly, in some embodiments, the electron gun further comprises a sub-anode (in some embodiments, such as described above with reference to the electron gun according to the teachings herein) in the volume between the isolation electrode and the anode, the method further comprising: applying a potential to the sub-anode that is not less than 100 V, not less than 200 V, not less than 300 V and even not less than 600 V more positive than the potential applied to the isolation electrode. In some embodiments, the potential applied to the sub-anode is not more than 1000 V more positive than the potential applied to the isolation electrode. In an experiment described herein, the potential applied to the sub-anode electrode was 600 V more positive than the potential applied to the isolation electrode.

Vacuum

In some embodiments, the volume between the front electrode and the anode is maintained at a low pressure. In some embodiments, the pressure in the volume between the front electrode and the anode is not more than $10^{-4}$ mbar (0.01 Pascal) and in some embodiments, not more than $10^{-5}$ mbar (0.001 Pascal).

Uses of Electron Beams

An electron beam produced in accordance with the teachings herein may be used for some further purpose, for example, to generate radiation, to generate a transient image or to cause a physical change.

Thus, according to an aspect of some embodiments of the teachings herein, there is provided a method of generating radiation, comprising: producing an electron beam according to the teachings herein; and directing the produced electron beam into a magnetic field, thereby generating radiation. In some embodiments, the magnetic field is of a radiation-generating device, and the electron-beam thereby drives the radiation-generating device. In some embodiments, the radiation-generating device is selected from the group consisting of a gyrotron tube, a magnetron, klystron and traveling-wave tube and electron-beam tomograph. In some embodiments, the frequency of the generated radiation is between 1 and 300 GHz.

Thus, according to an aspect of some embodiments of the teachings herein, there is also provided a method of generating a transient image, comprising: producing an electron beam according to any of the embodiments of the teachings herein; and directing the produced electron beam to excite a phosphorescent material to release light, wherein the released light constitutes at least part of a transient image. In some embodiments, the phosphorescent material and the paraelectric cathode are components of a cathode ray tube. In some embodiments, the cathode ray tube is a component of a device selected from the group consisting of a display, a computer monitor, a television, a radar screen and an oscilloscope.

Thus, according to an aspect of some embodiments of the teachings herein, there is also provided a method of causing a physical change, comprising: producing an electron beam according to any of the embodiments of the teachings herein; and directing the produced electron beam at a material to cause a permanent chemical or physical change in the surface.

In some such embodiments, the paraelectric cathode is a component of an electron beam lithography system, and the physical change is forming a lithographic image.

In some such embodiments, the paraelectric cathode is a component of an electron beam sterilization system, and the physical change is destruction of pathogens and microorganisms.

In some such embodiments, the paraelectric cathode is a component of an electron beam welding system, and the physical change is welding of at least one workpiece.

In some such embodiments, the paraelectric cathode is a component of an electron beam machining system, and the physical change is vaporization of a portion of a workpiece.

In some such embodiments, the paraelectric cathode is a component of an electron beam melting system, and the physical change is melting of feedstock (metal powder or particles) to form an object.

EXPERIMENTAL

Electron Gun and Paraelectric Cathode According to the Teachings Herein

An electron gun including a paraelectric cathode 24 according to the teachings herein, schematically depicted in FIG. 2, was constructed.

Paraelectric cathode 24 was made by sandwiching a 2 mm-thick, 18 mm-diameter disk of barium titanate ($BaTiO_3$) as a paraelectric layer 26 between two 17.5 mm-diameter disks of 0.064 mm-thick copper foil backed with 0.036 mm-thick layer of adhesive (e.g., from 3M, St. Paul, Minn., USA) as back electrode 32 on proximal face 28 of paraelectric layer 26 and as front electrode 34 on distal face 30 of paraelectric layer 26.

Prior to association with paraelectric layer 26, a 600 micrometer diameter steel needle was used to perforate the incipient front electrode 34 with twenty-seven holes 36 arranged to form a 13 mm-diameter ring pattern, where each hole 36 was spaced ~1.5 mm from the two neighboring holes 36.

The thus-produced paraelectric cathode 24 was placed in a 20 mm-long 25 mm-outer diameter cylindrical ABS holder 42 custom-made using a 3D-printer (UP Plus 2 from Easy 3D Model Ltd., Herzliya, Israel).

An isolation electrode 44 made of 0.3 mm thick grid of copper (which was 40% material, thereby having 60% transparency) held in place in an appropriate slot of ABS holder 42 in parallel to and 9 mm from front electrode 34 of paraelectric cathode 24.

Electron gun 48 was made by supporting the ABS holder 42 with the paraelectric cathode 24 and isolation electrode 44 inside a sealed alumina ceramic 10 cm-long and 6"-diameter cylindrical electron gun body 50. Electrical leads 46 were connected to back electrode 32, front electrode 34 and isolation electrode 44 and passed through sealed passages in the body base 52, also of alumina ceramic. A copper flange 58 holding a quartz window 60 serving as an anode was snugly fit and secured with silicone sealant to the distal end of electron gun body 50.

In some cases, prior to securing of the copper flange anode 58, a phosphor screen 62 (UHV from Kimball Physics Inc., Wilton, N.H., USA) was placed 5 cm distally from the front electrode.

Assembly of the Experimental Set-Up

The electrical leads 46 of front electrode 34, back electrode 32, isolation electrode 44 and anode 58 were connected to a power supply 68 including a fast high voltage switch 70.

A rotary vacuum pump (mini-TASK AG 81 from Agilent Technologies, Santa Clara, Calif., USA) was functionally associated with a vacuum port of the body.

A Rogowski coil functionally associated with a multimeter was placed around the anode electrical lead 46d.

The distal end of electron gun 48 was placed inside a gun solenoid 66 having a 20 cm-long 6.5" (16.5 cm) diameter bore and a ~11G/A ratio. To cause magnetic compression of an electron beam made by electron gun 48, electron gun 48 was positioned inside gun solenoid 66 so front electrode 34 of paraelectric cathode 24 was located on the magnetic field gradient of gun solenoid 66 at 6 G/A in the middle of the solenoid bore, 10 cm from either end of the gun solenoid 66 while the phosphor screen 62 was located at 10 G/A.

A DFK 21BU04.H camera (The Imaging Source Europe, GmbH, Bremen, Germany) was placed to acquire images of and through quartz window 60 with a shutter speed of 0.1 ms.

Production of a Low-Energy Annular Electron Beam and Effect of Magnetic Field on Beam Cross Section Vacuum pump 56 was activated to maintain a pressure of $10^{-5}$ mbar (~$10^{-3}$ Pascal) inside the internal volume of the electron gun 48.

Gun solenoid 66 was activated to generate an axial magnetic field.

Anode 58 was grounded. Power supply 68 was activated to supply a DC rest potential of −3 kV to back electrode 32, front electrode 34 and isolation electrode 44 relative to anode 58.

For each individual experiment, the fast voltage switch of power supply 68 was activated to apply a 1.6 kV ~300 ns excitation potential pulse to back electrode 32 and isolation electrode 44 so that during the excitation potential pulse back electrode 32 and isolation electrode 44 were 1.6 kV more positive than front electrode 34. Simultaneously with the excitation potential pulse, a triggering signal for the camera to acquire an image of quartz window 60, phosphor screen 62 and front electrode 34 was generated.

Each excitation potential pulse led to the production of an electron beam that impacted the phosphor screen 62 and quartz window 60. The cross sectional shape of the electron beam generated as a result of each excitation potential pulse as made apparent by phosphor screen 62 was captured by the camera.

The magnetic field strength was varied by varying the current passing through gun solenoid 66.

Low Energy Electron Beam without Phosphor Screen

In a first set of experiments, the electron gun was activated as described above without the presence of the phosphor screen. Images of the distal surface of the front electrode were acquired by the camera through the quartz window.

Consistently, the images showed that the excitation potential pulses led to the generation of plasma in the twenty-seven holes, that the generated plasma remained isolated inside holes 36, and that there was no voltage breakdown or short circuit with the isolation electrode or anode.

Low Energy Electron Beam with Phosphor Screen

In a second set of experiments, the electron gun was activated as described above with the presence of the phosphor screen inside the electron gun. Images of the phosphor screen were acquired by the camera through the quartz window, allowing evaluation of the cross section of a generated electron beam.

Figure 7A:
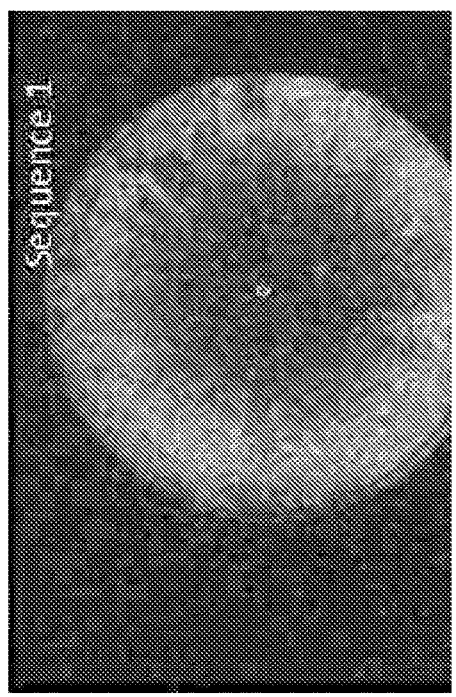
FIGS. 7A, 7B, 7C and 7D show experimental results of annular cross section low-energy electron beams produced according to the teachings herein, where the left image is a reproduction of a sum of photographs of a phosphor screen irradiated by a produced electron beam and the right graph is a mathematical analysis of the electron density as a function or distance from the electron gun axis where each one of FIG. 7 relates to the electron beam passing through a different intensity magnetic field: 0G (FIG. 7A), 50G (FIG. 7B), 100G (FIG. 7C) and G (FIG. 7D)
Figure 7A:
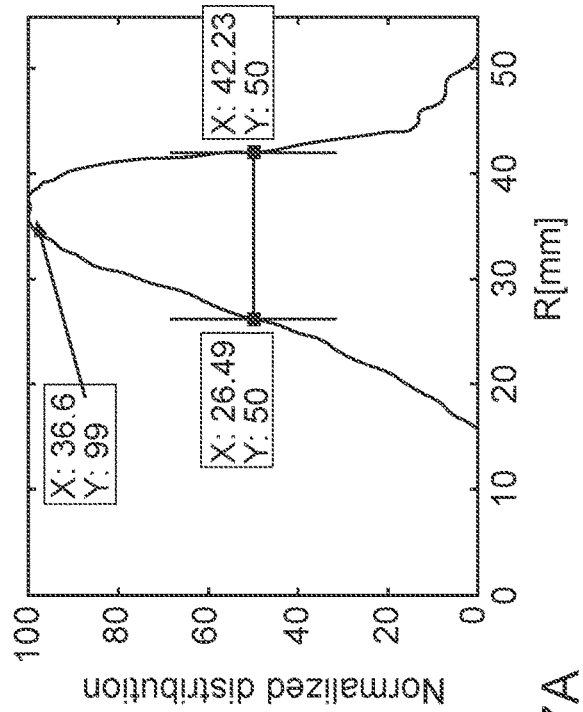
Figure 7B:
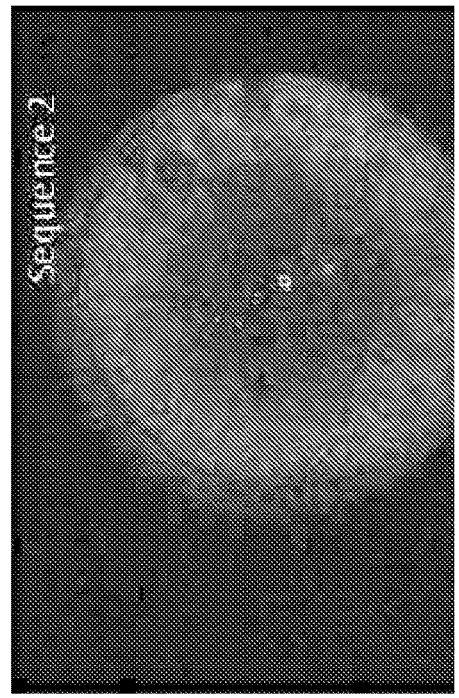
Figure 7B:
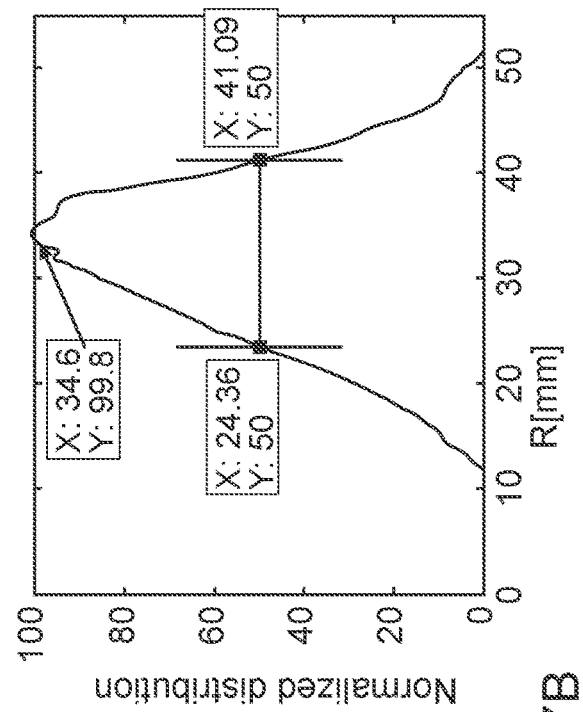
Figure 7C:
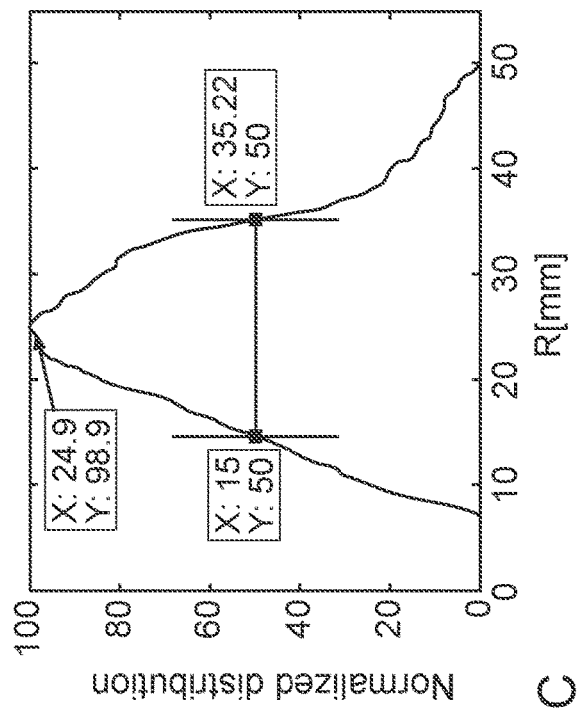
Figure 7C:
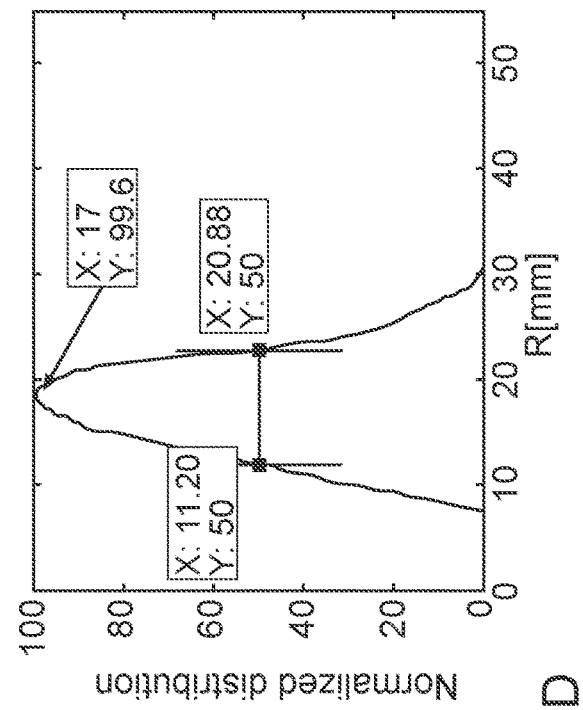
Figure 7D:
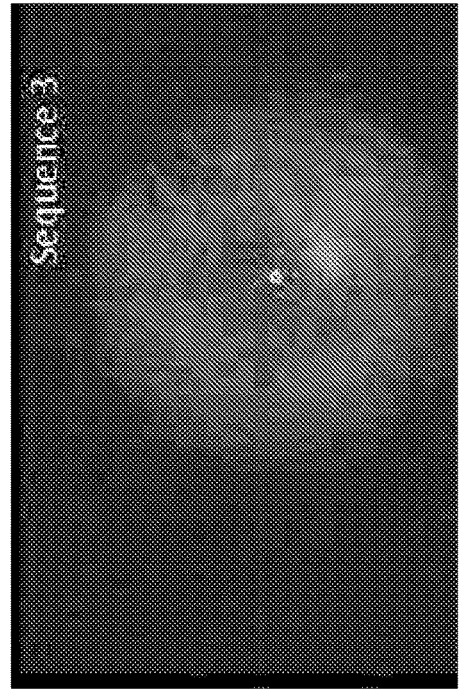

In each individual experiment, the gun solenoid was operated to generate a different-strength magnetic field (0G, 50G, 100G and 150G), twenty individual ~300 nanoseconds excitation potential pulses were applied to front electrode 34 and twenty images were acquired. The twenty images were combined and analyzed (using Matlab by the MathWorks Inc., Natick, Mass., USA). The results are depicted in FIG. 7A (0G), FIG. 7B (50G), FIG. 7C (100G) and FIG. 7D (150G), where the left column is a reproduction of the sum of twenty images and the right column is the result of the mathematical analysis of the respective combined image to show the relative beam intensity as a function of distance from electron gun axis. In all cases, it was seen that the cross sections of the generated electron beams were annular, with few electrons along the electron gun axis. It was also seen that the electron beam became more focused with increased magnetic field intensity.

The calculated average beam radius and beam width (FWHM) are listed in Table 1:

TABLE 1

|  | 0 G | 50 G | 100 G | 150 G |
| --- | --- | --- | --- | --- |
| average beam radius [mm] | 36.6 | 34.6 | 24.9 | 17 |
| beam width (FWHM) [mm] | — | — | 20.22 | 9.6 |
| outer radius [mm] | — | — | 35 | 21.6 |
| inner radius [mm] | 26 | 25 | 16 | 12 |

With 0G and 50G magnetic fields, it was apparent that the outer diameters of the electron beams were greater than the size of the phosphor screen so it was not possible to calculate the beam width It was noted during the experiments performed at 100G and 150G that the phosphor screen was progressively damaged due to the intensity of the beam. Attempts to operate the electron gun with higher magnetic fields caused the phosphor screen to be inoperable.

Production of a High-Energy Annular Electron Beam Suitable for Driving a Gyrotron The electron gun was modified to produce a high-energy electron beam focused with a strong magnetic field to be suitable for use in driving a gyrotron.

The experiments were performed without the phosphor screen inside the electron gun.

A cylindrical copper sleeve, 20 mm long, 20 mm inner diameter, 23 mm outer diameter was placed around the distal end of the ABS holder to protrude 5 mm distally therefrom as a sub-anode to help prevent voltage breakdowns. It was found that the sub-anode not only reduced the incidence of voltage breakdown, but also shortened the generation of the electron beam after the end of an excitation potential pulse.

The vacuum pump was activated to maintain a pressure of $10^{-5}$ mbar (0.001 Pascal) inside the volume of the electron gun.

The gun solenoid was activated to generate an axial magnetic field.

The anode was grounded. The power supply was activated to supply a DC rest potential of −50 kV to the back electrode, front electrode and isolation electrode relative to the anode. A potential of +600 V DC relative to the front electrode was applied to the sub-anode.

For each individual experiment, the fast voltage switch of the power supply was activated to apply a 3.5 kV ~300 nanosecond excitation potential pulse to the back electrode and the isolation electrode so that during the excitation potential pulse the back electrode and the isolation electrode were 3.5 kV more positive than the front electrode. Simultaneously with the excitation potential pulse, a triggering signal for the camera to acquire an image of the quartz window, phosphor screen and front electrode was generated.

Figure 8:
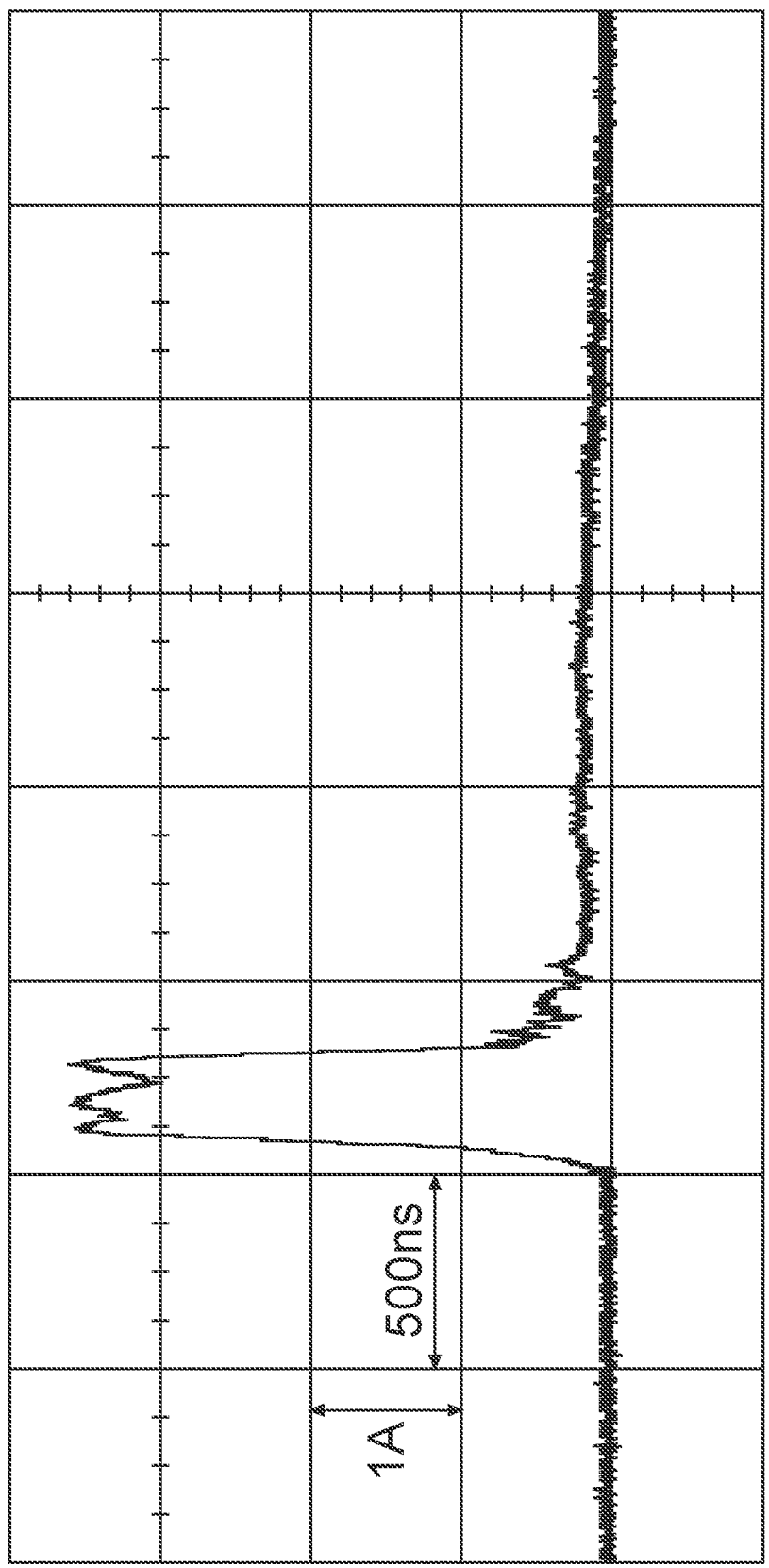
FIG. 8 depicts the current generated at the anode of an electron gun including a paraelectric cathode according to an embodiment of the teachings herein, when generating a relatively high energy electron beam.

The result of a typical experiment is shown in FIG. 8, performed using a magnetic field of ~260G showing the current produced at anode as measured by the Rogovski Coil. It is seen that a very intense (~3.5 A) and narrow (~250 ns) of electrons was generated for each excitation potential pulse.

Additionally, each excitation potential pulse lead to the generation of an electron beam that impacted the quartz window to emit visible light. The annular cross sectional shape of the electron beam generated as a result of each excitation potential pulse made apparent by the light emitted by the quartz window was captured by the camera.

Study of the image indicates that the presence of generated plasma in the holes as well as impact of electrons on the quartz window is substantially simultaneous. This indicates that there was a momentary continuous beam of electrons from the front electrode to the quartz window yet there was no voltage breakdown. Accordingly, the plasma generated was sufficiently intense to generate an intense electron beam that was at the same time sufficiently controlled by the electron gun to prevent plasma expansion that would lead to voltage breakdown, a requirement for en electron source to drive microwave and millimeter wave generating devices.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the scope of the appended claims.

Citation or identification of any reference in this application shall not be construed as an admission that such reference is available as prior art to the invention.

Section headings are used herein to ease understanding of the specification and should not be construed as necessarily limiting.

REFERENCES

1. M. Einat, M. Pilossof, R. Ben-Moshe, H. Hirshbein, and D. Borodin, "95-GHz gyrotron with ferroelectric cathode", Physical Review Letters, Vol. 109, P. 185101 (2012). [I.F. 7.512, 11 cites].
2. R. Ben-Moshe and M. Einat, "23 GHz ferroelectric electron gun based gyrotron", Applied Physics Letters, Vol. 98, P. 173506 (2011). [I.F. 3.3, 6 cites].
3. Yafit Orbach, Roey Ben-Moshe, Moritz Pilossof, and Moshe Einat, "Gyrotron with dual electrode ferroelectric cathode operating at high repetition rate and long pulse", IEEE Transactions on Electron Devices, VOL. 61, NO. 3, pp. 921-925, (2014). [I.F. 2.472, 4 cites].
4. M. Einat, E. Jerby, A. Shahadi, "Dielectric-loaded free-electron maser in stripline structure," Nuclear Instruments and Methods A, Vol. A375, pp. 21-25 (1996). [I.F. 1.216, 8 cites].

5. Eviatar Avraham, Roey Ben-Moshe, Moritz Pilossof, Moshe Einat, "Frequency-replaceable ferroelectric cathode gyrotron for the entire Ka-band", IEEE Transactions on Electron Devices, Volume: 63, Issue: 5, pp. 2097-2103, (2016). [I.F. 2.472, 0 cites].
6. R. Drori, M. Einat, D. Shur, E. Jerby, G. Rosenman, R. Advani, R. J. Temkin, and C. Pralong, "Demonstration of microwave generation by a ferroelectric-cathode tube", Applied Physics Letters, Vol. 74, pp. 335-337 (1999). [I.F. 3.3, 39 cites]
7. M. Pilossof and M. Einat, "Lifetime extension of ferroelectric cathodes for microwave tubes", Nuclear Instruments and Methods in Physics Research Section A: Accelerators, Spectrometers, Detectors and Associated Equipment, Vol. 636, Issue 1, pp. 8-12, (2011). [I.F. 1.216, 8 cites].
8. M. Einat, D. Shur, E. Jerby, and G. Rosenman, "Lifetime of ferroelectric Pb(Zr,Ti)O3 ceramic cathodes with high current density", Journal of Applied Physics, Vol. 89, pp. 548-552 (2001). [I.F. 2.183, 24 cites].
9. Yafit Orbach, Moritz Pilossof, and Moshe Einat, "Ferroelectric cathode electron emission dependence on magnetic field", IEEE Transactions on Electron Devices, VOL. 61, NO. 12, pp. 4268-4272, (2014). [I.F. 2.472, 1 cites].
10. Yafit Orbach, Tuviya Nissan, Yedidya Bauer, Moritz Pilossof, Moshe Einat, "Experimental study of 50 kV/3.5 A hollow electron beam produced by ferroelectric cathode", IEEE Transactions on Electron Devices, Vol. 63, 5, pp. 2156-2162, (2016). [I.F. 2.472, 0 cites].

The invention claimed is:

1. An electron gun, comprising:
a paraelectric cathode including:
  a paraelectric layer, of paraelectric material, having a proximal face and a distal face, said paraelectric layer sandwiched between:
    on said proximal face, a back electrode; and
    on said distal face, a front electrode including at least one hole,
said hole providing fluid communication between said distal face of said paraelectric layer and a volume distal to said front electrode,
said electron gun further comprising electrical leads functionally associated with said front electrode and said back electrode, said electrical leads configured:
  to carry a front electrode rest potential to said front electrode and a back electrode rest potential to said back electrode, both said electrode rest potentials of not less than −500 V different from an anode potential; and
  to carry to at least one of said front electrode and said back electrode an excitation potential pulse that increases the absolute value of a potential difference between said front electrode and said back electrode by not less than 300 V at a rate not slower than 6 V/nanosecond from the potential difference between said electrode rest potentials.

2. The electron gun of claim 1, said electrical leads configured to carry a front electrode rest potential to said front electrode and back electrode rest potential to said back electrode, both rest potentials of not less than −500V different from a potential of an anode.

3. The electron gun of claim 1, further comprising, distal to said front electrode in said volume, an isolation electrode.

4. The electron gun of claim 3, further comprising an electrical lead functionally associated with said isolation electrode, optionally wherein said electrical lead functionally associated with said isolation electrode and an electrical lead functionally associated with said back electrode are configured to simultaneously carry a same potential.

5. The electron gun of claim 3, wherein said isolation electrode has a shape selected from the group consisting of a grid, a ring, a cylinder, a rod, a sheet, at least two rods and at least two sheets.

6. The electron gun of claim 3, wherein said isolation electrode is not less than 500 micrometers from a distal surface of said front electrode.

7. The electron gun of claim 1, wherein said at least one hole is at least two holes, optionally wherein a minimal distance between any two said holes is not less than 200 micrometers.

8. The electron gun of claim 1, wherein said at least one hole comprises at least two holes arranged in a predetermined pattern on said front electrode, optionally wherein said predetermined pattern is centered around a central axis of said paraelectric cathode.

9. The electron gun of claim 8, said predetermined pattern selected from the group consisting of a line, a solid closed curve and a hollow closed curve.

10. The electron gun of claim 1, further comprising an electrical power supply, functionally associated with said back electrode and with said front electrode, said electrical power supply configured to:
  provide a back electrode rest potential to said back electrode and a front electrode rest potential to said front electrode of not less than −500V different from an anode; and
  on activation, to provide an excitation potential pulse to at least one of said front electrode and said back electrode, said excitation pulse sufficient to increases the absolute value of the potential difference between said front electrode and said back electrode by not less than 300 V at a rate not slower than 6 V/nanosecond.

11. The electron gun of claim 10, said electrical power supply configured to provide a train of successive said excitation potential pulses.

12. A device, comprising:
  an electron gun of claim 1; and
  a component to controllably change at least one property of an electron beam produced by said electron gun.

13. The device of claim 12, selected from the group consisting of an image-forming device, a physical-change device, and a radiation-generating device, optionally the device being a radiation-generating device selected from the group consisting of a gyrotron, a magnetron, a klystron, a travelling-wave tube and an electron-beam tomograph.

14. A method of producing an electron beam, comprising:
  a. providing an electron gun of claim 1;
  b. during a rest period, maintaining said back electrode at a back electrode rest potential and said front electrode at a front electrode rest potential, both said rest potentials not less than −500 V different from an anode potential, wherein an electrode rest potential difference value is not greater than 200 V;
  c. applying at least one excitation potential pulse having a duration not greater than 2.5 microsecond to said paraelectric cathode, wherein:
    i. during said application of said excitation potential pulse, increasing the absolute value of the potential difference between said front electrode and said back electrode to not less than 300 V greater than said electrode rest potential difference value at a rate not slower than 6 V/nanosecond, thereby generating plasma in said at least one hole of said front electrode, ii. subsequent to 'i', maintaining said generated plasma in said at least one hole for a period of not less than 50 nanoseconds, and
iii. subsequent to 'ii', extinguishing said plasma by reducing the value of the potential difference between said front electrode and said back electrode; and
d. during 'c', extracting electrons from said generated plasma towards said anode as a beam of electrons.

15. The method of claim 14, wherein said back electrode rest potential and said front electrode rest potential are substantially the same.

16. The method of claim 14, wherein said duration of said at least one excitation potential pulse is not more than 2 microseconds.

17. The method of claim 14, wherein said duration of said at least one excitation potential pulse is not less than 75 nanoseconds.

18. The method of claim 14, wherein said at least one excitation potential pulse comprises a train of at least two successive excitation potential pulses within a period of 1 millisecond.

19. The method of claim 14, wherein said at least one hole comprises at least two holes arranged in a predetermined pattern on said front electrode, and said electron beam produced thereby has a cross sectional shape corresponding to said predetermined shape.

20. An electron gun, comprising:
a paraelectric cathode including:
a paraelectric layer, of paraelectric material, having a proximal face and a distal face, said paraelectric layer sandwiched between:
on said proximal face, a back electrode; and
on said distal face, a front electrode including at least one hole,
said hole providing fluid communication between said distal face of said paraelectric layer and a volume distal to said front electrode,
the electron gun further comprising an electrical power supply, functionally associated with said back electrode and with said front electrode, said electrical power supply configured to:
provide a back electrode rest potential to said back electrode and a front electrode rest potential to said front electrode of not less than −500V different from an anode; and
on activation, to provide an excitation potential pulse to at least one of said front electrode and said back electrode, said excitation pulse sufficient to increases the absolute value of the potential difference between said front electrode and said back electrode by not less than 300 V at a rate not slower than 6 V/nanosecond.

21. The electron gun of claim 20, said electrical leads configured to carry a front electrode rest potential to said front electrode and back electrode rest potential to said back electrode, both rest potentials of not less than −500V different from a potential of an anode.

22. The electron gun of claim 20, further comprising, distal to said front electrode in said volume, an isolation electrode.

23. The electron gun of claim 22, further comprising an electrical lead functionally associated with said isolation electrode, optionally wherein said electrical lead functionally associated with said isolation electrode and an electrical lead functionally associated with said back electrode are configured to simultaneously carry a same potential.

24. The electron gun of claim 22, wherein said isolation electrode has a shape selected from the group consisting of a grid, a ring, a cylinder, a rod, a sheet, at least two rods and at least two sheets.

25. The electron gun of claim 22, wherein said isolation electrode is not less than 500 micrometers from a distal surface of said front electrode.

26. The electron gun of claim 22, wherein said at least one hole is at least two holes, optionally wherein a minimal distance between any two said holes is not less than 200 micrometers.

27. The electron gun of claim 20, wherein said at least one hole comprises at least two holes arranged in a predetermined pattern on said front electrode, optionally wherein said predetermined pattern is centered around a central axis of said paraelectric cathode.

28. The electron gun of claim 27, said predetermined pattern selected from the group consisting of a line, a solid closed curve and a hollow closed curve.

29. The electron gun of claim 28, said electrical power supply configured to provide a train of successive said excitation potential pulses.

30. A device, comprising:
an electron gun of claim 20; and
a component to controllably change at least one property of an electron beam produced by said electron gun.

31. The device of claim 30, selected from the group consisting of an image-forming device, a physical-change device, and a radiation-generating device, optionally the device being a radiation-generating device selected from the group consisting of a gyrotron, a magnetron, a klystron, a travelling-wave tube and an electron-beam tomograph.

32. A method of producing an electron beam, comprising:
a. providing an electron gun of claim 20;
b. during a rest period, maintaining said back electrode at a back electrode rest potential and said front electrode at a front electrode rest potential, both said rest potentials not less than −500 V different from an anode potential, wherein an electrode rest potential difference value is not greater than 200 V;
c. applying at least one excitation potential pulse having a duration not greater than 2.5 microsecond to said paraelectric cathode, wherein:
i. during said application of said excitation potential pulse, increasing the absolute value of the potential difference between said front electrode and said back electrode to not less than 300 V greater than said electrode rest potential difference value at a rate not slower than 6 V/nanosecond, thereby generating plasma in said at least one hole of said front electrode,
ii. subsequent to 'i', maintaining said generated plasma in said at least one hole for a period of not less than 50 nanoseconds, and
iii. subsequent to 'ii', extinguishing said plasma by reducing the value of the potential difference between said front electrode and said back electrode; and
d. during 'c', extracting electrons from said generated plasma towards said anode as a beam of electrons.

33. The method of claim 32, wherein said back electrode rest potential and said front electrode rest potential are substantially the same.

34. The method of claim 32, wherein said duration of said at least one excitation potential pulse is not more than 2 microseconds.

35. The method of claim 32, wherein said duration of said at least one excitation potential pulse is not less than 75 nanoseconds.

36. The method of claim 32, wherein said at least one excitation potential pulse comprises a train of at least two successive excitation potential pulses within a period of 1 millisecond.

37. The method of claim 32, wherein said at least one hole comprises at least two holes arranged in a predetermined pattern on said front electrode, and said electron beam produced thereby has a cross sectional shape corresponding to said predetermined shape.

38. A method of producing an electron beam, comprising:
   a. providing an electron gun, comprising:
      a paraelectric cathode including:
         a paraelectric layer, of paraelectric material, having a proximal face and a distal face, said paraelectric layer sandwiched between:
         on said proximal face, a back electrode; and
         on said distal face, a front electrode including at least one hole,
   said hole providing fluid communication between said distal face of said paraelectric layer and a volume distal to said front electrode;
   b. during a rest period, maintaining said back electrode at a back electrode rest potential and said front electrode at a front electrode rest potential, both said rest potentials not less than −500 V different from an anode potential, wherein an electrode rest potential difference value is not greater than 200 V;
   c. applying at least one excitation potential pulse having a duration not greater than 2.5 microsecond to said paraelectric cathode, wherein:
      i. during said application of said excitation potential pulse, increasing the absolute value of the potential difference between said front electrode and said back electrode to not less than 300 V greater than said electrode rest potential difference value at a rate not slower than 6 V/nanosecond, thereby generating plasma in said at least one hole of said front electrode,
      ii. subsequent to 'i', maintaining said generated plasma in said at least one hole for a period of not less than 50 nanoseconds, and
      iii. subsequent to 'ii', extinguishing said plasma by reducing the value of the potential difference between said front electrode and said back electrode; and
   d. during 'c', extracting electrons from said generated plasma towards said anode as a beam of electrons.

39. The method of claim 38, wherein said back electrode rest potential and said front electrode rest potential are substantially the same.

40. The method of claim 38, wherein said duration of said at least one excitation potential pulse is not more than 2 microseconds.

41. The method of claim 38, wherein said duration of said at least one excitation potential pulse is not less than 75 nanoseconds.

42. The method of claim 38, wherein said at least one excitation potential pulse comprises a train of at least two successive excitation potential pulses within a period of 1 millisecond.

43. The method of claim 38, wherein said at least one hole comprises at least two holes arranged in a predetermined pattern on said front electrode and said electron beam produced thereby has a cross sectional shape corresponding to said predetermined shape.

\* \* \* \* \*